(12) United States Patent
Kim et al.

(10) Patent No.: US 11,508,732 B2
(45) Date of Patent: Nov. 22, 2022

(54) SEMICONDUCTOR DEVICES HAVING AIR SPACER

(71) Applicant: Samsung Electronics Co., Ltd., Suwon-si (KR)

(72) Inventors: Jihee Kim, Yongin-si (KR); Yeongshin Park, Seoul (KR); Hyunchul Yoon, Seongnam-si (KR); Joonghee Kim, Anyang-si (KR); Jungheun Hwang, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 24 days.

(21) Appl. No.: 17/028,763

(22) Filed: Sep. 22, 2020

(65) Prior Publication Data

US 2021/0210493 A1 Jul. 8, 2021

(30) Foreign Application Priority Data

Jan. 2, 2020 (KR) .................. 10-2020-0000487

(51) Int. Cl.
*H01L 27/108* (2006.01)
*H01L 21/768* (2006.01)
*H01L 29/66* (2006.01)
*H01L 21/764* (2006.01)

(52) U.S. Cl.
CPC ...... *H01L 27/10814* (2013.01); *H01L 21/764* (2013.01); *H01L 21/7682* (2013.01); *H01L 27/10823* (2013.01); *H01L 27/10826* (2013.01); *H01L 29/6656* (2013.01)

(58) Field of Classification Search
CPC .............. H01L 21/764; H01L 21/7682; H01L 27/10814; H01L 27/10823; H01L 27/10826; H01L 29/6656
See application file for complete search history.

(56) References Cited

U.S. PATENT DOCUMENTS

| 6,890,863 | B1 | 5/2005 | Donohoe et al. |
| 9,012,321 | B1 | 4/2015 | Kim et al. |
| 9,865,472 | B2 | 1/2018 | Chebi et al. |

(Continued)

FOREIGN PATENT DOCUMENTS

| JP | 2001077087 A | 3/2001 |
| KR | 1020040050797 A | 6/2004 |

(Continued)

*Primary Examiner* — Matthew E Warren
(74) *Attorney, Agent, or Firm* — Muir Patent Law, PLLC

(57) ABSTRACT

A semiconductor device includes bit line structures disposed on a substrate, each bit line structure comprising a bit line and an insulating spacer structure, buried contacts which fill lower portions of spaces between bit line structures in the substrate, and landing pads which fill upper portions of the spaces, extend from upper surfaces of the buried contacts to upper surfaces of the bit line structures, and are spaced apart from each other by insulating structures. A first insulating structure is disposed between a first landing pad and a first bit line structure. The first insulating structure includes a sidewall extending along a sidewall of the first landing pad toward the substrate. In a direction extending toward the substrate, the sidewall of the first insulating structure gets closer to a first sidewall of the first bit line structure.

10 Claims, 23 Drawing Sheets

(56) References Cited

U.S. PATENT DOCUMENTS

| | | | |
|---|---|---|---|
| 10,074,656 B1* | 9/2018 | Wang | H01L 27/10888 |
| 10,256,112 B1 | 4/2019 | Wang et al. | |
| 2009/0130842 A1 | 5/2009 | Hwang et al. | |
| 2014/0051256 A1 | 2/2014 | Zhong et al. | |
| 2015/0340281 A1* | 11/2015 | Lee | H01L 21/7682 |
| | | | 438/618 |
| 2018/0261601 A1* | 9/2018 | Kim | H01L 27/10823 |
| 2019/0198389 A1 | 6/2019 | Ren et al. | |
| 2020/0066729 A1* | 2/2020 | Simsek-Ege | H01L 27/10814 |
| 2020/0194374 A1* | 6/2020 | Kim | H01L 21/76897 |

FOREIGN PATENT DOCUMENTS

| | | | | |
|---|---|---|---|---|
| KR | 1020060075993 A | | 7/2006 | |
| KR | 1020140023219 A | | 2/2014 | |
| KR | 20210053378 A | * | 5/2021 | ....... H01L 27/10814 |

* cited by examiner

SEMICONDUCTOR DEVICES HAVING AIR SPACER

CROSS-REFERENCE TO RELATED APPLICATION

This application claims the benefit of Korean Patent Application No. 10-2020-0000487, filed on Jan. 2, 2020, in the Korean Intellectual Property Office, the disclosure of which is incorporated by reference herein in its entirety.

BACKGROUND

The inventive concept relates to a semiconductor device, and more particularly, to a semiconductor device having an air spacer.

With the rapid development of electronic industries and the demands of users, electronic devices become smaller and more lightweight. Therefore, a high degree of integration is desirable in semiconductor devices used in electronic apparatuses, and a design rule for the semiconductor devices is being reduced. Accordingly, parasitic capacitance that degrade the operation performance of semiconductor devices are increasing in the semiconductor devices.

SUMMARY

The inventive concept provides a semiconductor device which has an air spacer capable of securing an operation performance of the semiconductor device.

According to an exemplary embodiment of the present inventive concept, a semiconductor device includes a plurality of bit line structures disposed on a substrate, each of the plurality of bit line structures comprising a bit line and an insulating spacer structure, the insulating spacer structure covering a sidewall of the bit line and having an air spacer, and the bit line structures being spaced apart from each other in a first horizontal direction and extending parallel to each other in a second horizontal direction different from the first horizontal direction, a plurality of buried contacts which fill lower portions of spaces between the plurality of bit line structures in the substrate, and a plurality of landing pads which fill upper portions of the spaces between the plurality of bit line structures, extend from upper surfaces of the plurality of buried contacts to upper surfaces of the plurality of bit line structures, and are spaced apart from each other by a plurality of insulating structures. A first insulating structure of the plurality of insulating structures is disposed between a first landing pad of the plurality of landing pads which are spaced apart from each other in the second horizontal direction with the plurality of insulating structures therebetween and a first bit line structure, adjacent to the first landing pad in the first horizontal direction, of the plurality of bit line structures. The first insulating structure includes a sidewall extending along a sidewall of the first landing pad toward the substrate. In a direction extending toward the substrate, the sidewall of the first insulating structure gets closer to a first sidewall of the first bit line structure.

According to an exemplary embodiment of the present inventive concept, a semiconductor device includes a substrate in which a plurality of active regions are defined, a plurality of bit line structures disposed on the substrate, each of the plurality of bit line structures comprising a bit line and an insulating spacer structure, the insulating spacer structure covering a sidewall of the bit line and having an air spacer, and the bit line structures being spaced apart from each other in a first horizontal direction and extending parallel to each other in a second horizontal direction different from the first horizontal direction, a plurality of buried contacts and a plurality of insulating fences disposed in lower portions of spaces between the plurality of bit line structures, the plurality of buried contacts and the plurality of insulating fences being alternately arranged in the second horizontal direction, a plurality of landing pads which fill upper portions of the spaces between the plurality of bit line structures, extend in a vertical direction from upper surfaces of the plurality of buried contacts to upper surfaces of the plurality of bit line structures, and are electrically connected to the plurality of active regions via the plurality of buried contacts, a plurality of recess portions, each of the plurality of recess portions extending toward the substrate from between two landing pads, which are spaced apart from each other in the first horizontal direction, among the plurality of landing pads, a first recess portion of the plurality of recess portions being defined by a sidewall of a first landing pad of the two landing pads and a first sidewall of a first bit line structure of the plurality of bit line structures, and a plurality of insulating structures filling the plurality of recess portions. The plurality of landing pads are spaced apart from each other by the plurality of insulating structures. A second landing pad of the two landing pads is disposed on an upper surface of the first bit line structure and a second sidewall, opposite to the first sidewall, of the first bit line structure. In a direction extending toward the substrate, the sidewall of the first landing pad gets closer to the first sidewall of the first bit line structure. Between the two landing pads, a first insulating structure of the insulating structures has a bottom surface of which at least a portion is flat in the second horizontal direction.

According to an exemplary embodiment of the present inventive concept, a semiconductor device includes a substrate in which a plurality of active regions are defined, a plurality of word lines being parallel to each other and extending in a first horizontal direction across the plurality of active regions, a plurality of bit line structures disposed on the substrate, each of the plurality of bit line structures comprising a bit line and an insulating spacer structure, the insulating spacer structure covering a sidewall of the bit line and having an air spacer, and the bit line structures being parallel to each other and extending in a second horizontal direction perpendicular to the first horizontal direction, a plurality of insulating fences that are arrayed in a row in the second horizontal direction in spaces between the plurality of bit line structures in the substrate, a plurality of buried contacts which are arranged in spaces, which are defined by the plurality of bit line structures and the plurality of insulating fences, and electrically connected to the plurality of active regions, a plurality of landing pads disposed on the plurality of buried contacts, the plurality of landing pads extending from upper surfaces of the plurality of buried contacts to upper surfaces of the plurality of bit line structures, and a plurality of insulating structures disposed between the plurality of landing pads. The plurality of landing pads and the plurality of insulating structures are alternately arranged in the second horizontal direction. A first insulating structure of the plurality of insulating structures is disposed between a first landing pad of the plurality of landing pads which are spaced apart from each other in the first horizontal direction with the plurality of insulating structures therebetween and a first bit line structure, adjacent to the first landing pad in the first horizontal direction, of the plurality of bit line structures. The first insulating structure of the insulating structures includes a sidewall extending along a sidewall of the first landing pad toward the substrate. Between the first landing pad and the first bit line structure which are spaced apart from each other in the first horizontal direction, a center, in the first horizontal direction, of a lower end of the first insulating structure and a center, in the first horizontal direction, of an upper end of an air spacer of the first bit line structure are vertically aligned with each other.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
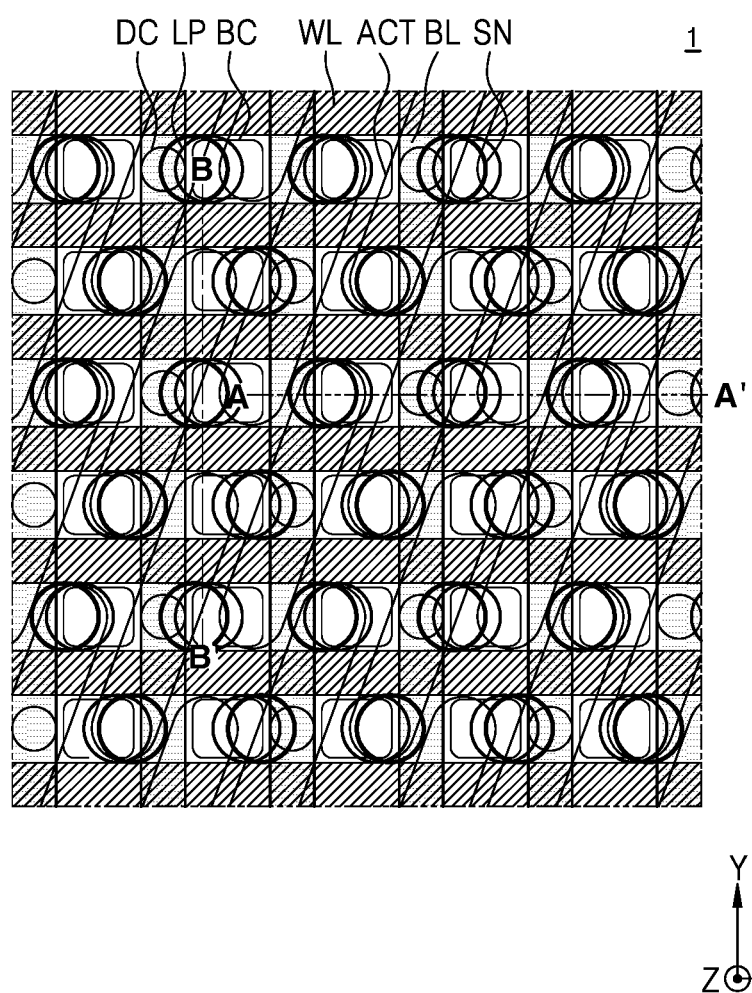
FIG. 1 is a layout illustrating a semiconductor device according to embodiments.

FIG. 1 is a layout illustrating a semiconductor device according to embodiments.

Referring to FIG. 1, a semiconductor device 1 includes a plurality of active regions ACT. In some embodiments, each of the plurality of active regions ACT has an elliptical shape with a long axis extending in a diagonal direction with respect to a first horizontal direction (X direction) and a second horizontal direction (Y direction).

A plurality of word lines WL are parallel to each other and extend across the plurality of active regions ACT in the first horizontal direction (X direction). Above the plurality of word lines WL, a plurality of bit lines BL are parallel to each other and extend in the second horizontal direction (Y direction) perpendicular to the first horizontal direction (X direction). The plurality of bit lines BL may be connected to the plurality of active regions ACT via direct contact DC.

In some embodiments, a plurality of buried contacts BC are formed between the two neighboring bit lines BL of the plurality of bit lines BL. In some embodiments, the plurality of buried contacts BC are arranged in a matrix form in which the buried contacts BC are arrayed in the first horizontal direction (X direction) and the second horizontal direction (Y direction).

Above the plurality of buried contacts BC, a plurality of landing pads LP may be formed. The plurality of landing pads LP overlap the buried contacts BC. In some embodiment, each landing pad LP partially overlaps a corresponding buried contact BC. In some embodiments, each of the plurality of landing pads LP may extend above one bit line BL of the two neighboring bit lines BL. For example, each landing pad LP may partially overlap a corresponding bit line BL.

The plurality of landing pads LP are arranged in a hexagonal array pattern in a plan view. For example, the plurality of landing pads LP are arranged in a honeycomb shape in which the landing pads LP are arrayed in a row in the first horizontal direction (X direction) and arrayed in a zigzag manner in the second horizontal direction (Y direction) in the plan view. A top surface of each of the plurality of landing pads LP may have a circular, disc shape. The present invention is not limited thereto. In some embodiments, a top surface of each landing pad LP may be elliptical.

Above the plurality of landing pads LP, a plurality of storage nodes SN may be formed. The plurality of storage nodes SN may be formed above the plurality of bit lines BL. The plurality of storage nodes SN are arranged in a hexagonal array pattern in a plan view. For example, the plurality of storage nodes SN are arranged in a honeycomb shape in which the storage nodes SN are arrayed in a row in the first horizontal direction (X direction) and arrayed in a zigzag manner in the second horizontal direction (Y direction) in the plan view. Each of the plurality of storage node SN may be a lower electrode of a corresponding capacitor of a plurality of capacitors. The storage nodes SN may be connected to the active regions ACT via the landing pads LP and the buried contacts BC.

In some embodiments, the semiconductor device 1 may be a dynamic random access memory (DRMA) device.

FIGS. 2A and 2B, FIGS. 3A and 3B, FIGS. 4A and 4B, FIGS. 5A and 5B, FIGS. 6A and 6B, FIGS. 7A and 7B, FIGS. 8A to 8C, and FIGS. 10A and 10B are cross-sectional views sequentially illustrating a manufacturing method of a semiconductor device according to embodiments. For example, FIG. 2A, FIG. 3A, FIG. 4A, FIG. 5A, FIG. 6A, FIG. 7A, FIG. 8A, and FIG. 10A are cross-sectional views taken along line A-A' of FIG. 1, FIG. 2B, FIG. 3B, FIG. 4B, FIG. 5B, FIG. 6B, FIG. 7B, FIG. 8B, and FIG. 0B are cross-sectional views taken along line B-B' of FIG. 1, and FIG. 8C is an enlarged cross-sectional view of region XIIIc of FIG. 8A.

Figure 2A:
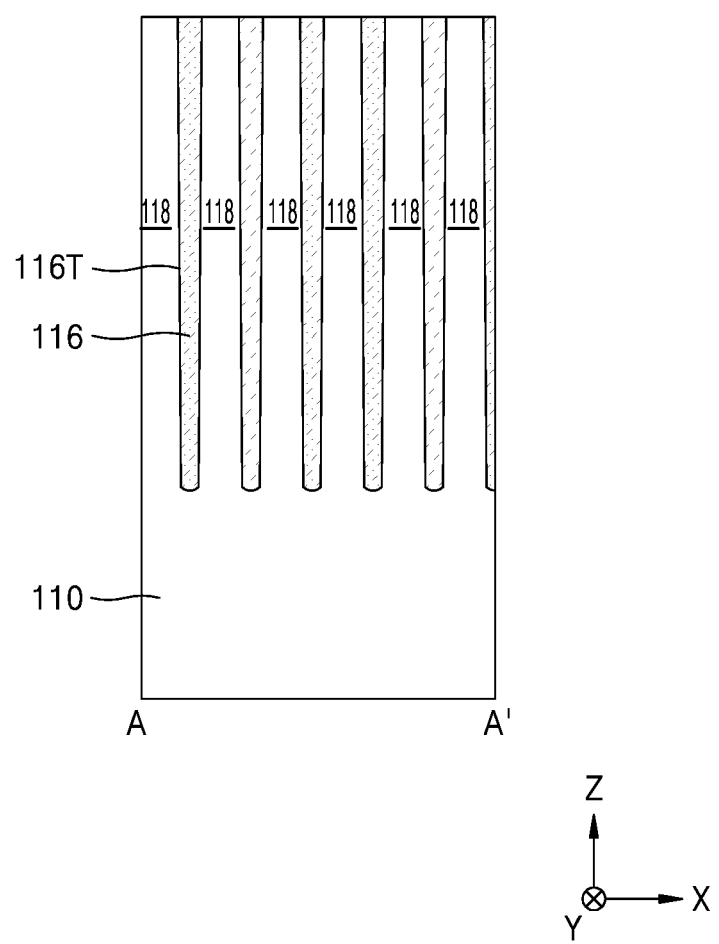
FIGS. 2A and 2B, FIGS. 3A and 3B, FIGS. 4A and 4B, FIGS. 5A and 5B, FIGS. 6A and 6B, FIGS. 7A and 7B, FIGS. 8A to 8C, and FIGS. 10A and 10B are cross-sectional views sequentially illustrating a manufacturing method of a semiconductor device according to embodiments.
Figure 2B:
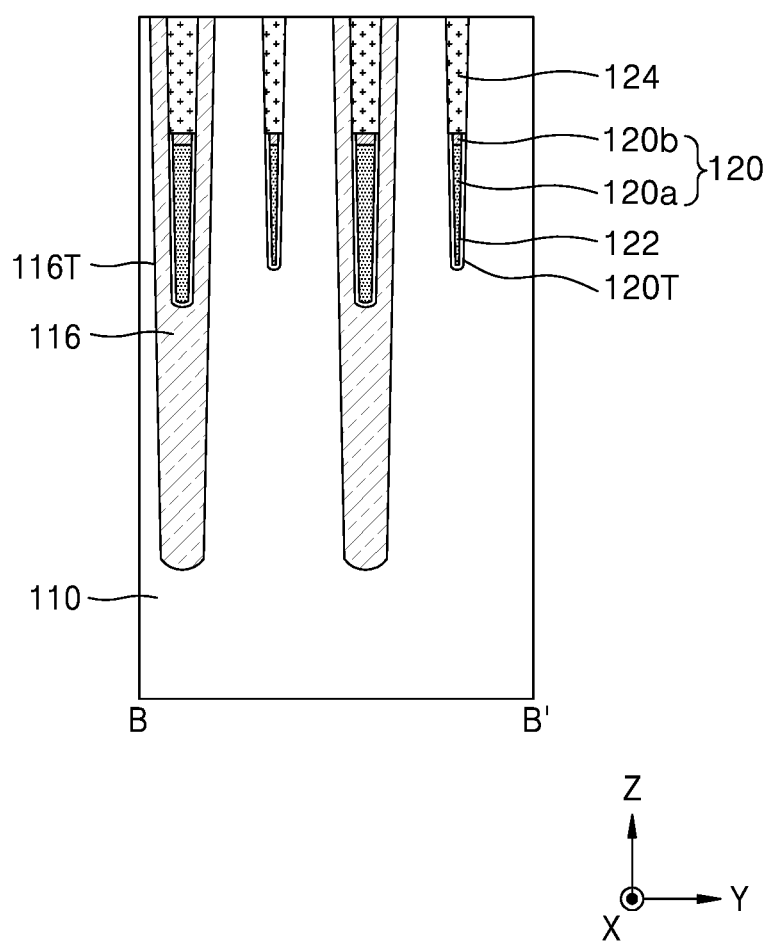

Referring to FIG. 2A and FIG. 2B together, element separation trenches 116T are formed in a substrate 110, and element separation films 116 for filling the element separation trenches 116T are formed.

The substrate 110 may include, for example, silicon (Si), such as, crystalline Si, polycrystalline Si, and amorphous Si. Also, the substrate 110 may include at least one compound semiconductor selected from a semiconductor element such as germanium (Ge), silicon germanium (SiGe), silicon carbide (SiC), gallium arsenide (GaAs), indium arsenide (InAs), and indium phosphide (InP). Also, the substrate 110 may be have a silicon on insulator (SOI) structure. For example, the substrate 110 may include a buried oxide (BOX) layer. The substrate 110 may include a conductive region, for example, a well doped with impurities or a structure doped with impurities.

Each of the element separation films 116 may be made of a material including, for example, at least one of a silicon oxide film, a silicon nitride film, and a silicon oxynitride film. The element separation film 116 may include a single layer including one type of insulating film, a double layer including two types of insulating films, or a multi layer including at least three types of insulating films. For example, the element separation film 116 may have a dual layer or a multi layer, which includes an oxide film and a nitride film. However, according to the inventive concept, the configuration of the element separation film 116 is not limited thereto. A plurality of active regions 118 may be defined in the substrate 110 by the element separation films 116.

Each of the active regions 118 may have an island, elliptical shape with a short axis and a long axis in a plan view, as in the active region ACT illustrated in FIG. 1. For example, the long axis of each active region 118 may be parallel to the diagonal direction with respect to the first horizontal direction (X direction) and the second horizontal direction (Y direction).

A plurality of word line trenches 120T are formed in the substrate 110. Each of the plurality of word line trenches 120T may have a line shape. The word line trenches 120T are parallel to each other and extend in the first horizontal direction (X direction), and pass through the active regions 118. The word line trenches 120T are spaced apart from each other at a substantially constant distance in the second horizontal direction (Y direction). The term "substantially constant distance" does not necessarily mean an identical distance, but is intended to encompass nearly identical distance within acceptable variations that may occur, for example, due to manufacturing processes. In some embodiments, a stepped portion may be formed on the bottom surfaces of the plurality of word line trenches 120T. In some embodiments, in a process of forming the plurality of word line trenches 120T, the element separation film 116 and the substrate 110 may be etched by separate etching processes, and thus, an etching depth of the element separation film 116 may be different from an etching depth of the substrate 110. In some embodiments, in a process of forming the plurality of word line trenches 120T, the element separation film 116 and the substrate 110 may be etched together, but due to difference in etch rates of the element separation film 160 and the substrate 110, an etching depth of the element separation film 116 may be different from an etching depth of the substrate 110. In some embodiments, each word line trench 120T may extend along the first horizontal direction (X direction) and have a first portion formed in the substrate 110 and a second portion formed in the element separation film 116. When the element separation film 116 and the substrate 110 are etched together or separately, an etching depth of the first portion in the substrate 110 may be different from an etching depth of the second portion in the element separation film 116. In some embodiments, the etching depth of the first portion in the substrate 110 may be smaller than the etching depth of the second portion in the element separation film 116. Such difference in the etching depths may form the step portion at the bottom of each word line trench 120T. In some embodiments, the first portion of each word line trench 120T and the second portion thereof may be alternately arranged along the first horizontal direction with a step portion at a boundary between the first portion and the second portion.

After the formation of the plurality of the word line trenches 120T, a cleaning process may be performed and then, a plurality of gate dielectric films 122, a plurality of word lines 120, and a plurality of buried insulating films 124 may be sequentially formed inside the plurality of word line trenches 120T. The plurality of word lines 120 may constitute the plurality of word lines WL as illustrated in FIG. 1. Each of the plurality of word lines 120 may have a line shape extending in the first horizontal direction (X direction). The word lines 120 that are parallel to each other and extend in the first horizontal direction (X direction) pass through the active regions 118, and are spaced apart from each other at a substantially constant distance in the second horizontal direction (Y direction). A top surface of each of the plurality of word lines 120 is positioned at a lower level than a top surface of the substrate 110. A bottom surface of each of the plurality of word lines 120 may have an uneven shape due to the steps at the bottoms of the word line trenches 120T, and transistors having a saddle fin (saddle fin-type field effect transistors (FinFETs)) may be formed in the plurality of the active regions 118.

In this specification, a level may refer to a height in a vertical direction (Z direction) with respect to a main surface or atop surface of the substrate 110. For example, being at the same level or at a constant level may refer to being at the same height or being at a constant height in the vertical direction (Z direction) with respect to the main surface or the top surface of the substrate 110. Being at lower/upper level may refer to being at a lower/higher height in the vertical direction (Z direction) with respect to the main surface of the substrate 110.

In some embodiments, each of the plurality of word lines 120 is a laminated structure of a lower word line layer 120a and an upper word line layer 120b. In some embodiments, the lower word line layer 120a may include a metal material, a conductive metal nitride, or a combination thereof. For example, the lower word line layer 120a may include Ti, TiN, Ta, TaN, W, WN, TiSiN, WSiN, or a combination thereof. In some embodiments, the upper word line layer 120b may include doped polysilicon. In some embodiments, the lower word line layer 120a may include a core layer and a barrier layer between the core layer and a gate dielectric film 122. For example, the core layer may include a metal material or a conductive metal nitride such as W, WN, TiSiN, or WSiN, and the barrier layer may include a metal material or a conductive metal nitride such as Ti, TiN, Ta, or TaN.

In some embodiments, after or before the plurality of word lines 120 are formed, impurity ions may be implanted into portions of the active regions 118 of the substrate 110 on opposite sides of the plurality of word lines 120, and thus, source regions and drain regions may be formed inside the plurality of active regions 118.

The gate dielectric film 122 may include at least one of a silicon oxide film, a silicon nitride film, a silicon oxynitride film, oxide/nitride/oxide (ONO), and high-k dielectric film having a higher dielectric constant than the silicon oxide film. For example, the gate dielectric film 122 may have a dielectric constant between about 10 and about 25. In some embodiment, the gate dielectric film 122 may include at least one material selected from hafnium oxide (HfO), hafnium silicate (HfSiO), hafnium oxynitride (fON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric film 122 may include $HfO_2$, $Al_2O_3$, $HfAlO_3$, $Ta_2O_3$, or $TiO_2$.

A top surface of the each of the plurality of buried insulating films 124 may be at substantially the same level as the top surface of the substrate 110. The buried insulating films 124 may include at least one material film selected from a silicon oxide film, a silicon nitride film, a silicon oxynitride film, and combination thereof.

Figure 3A:
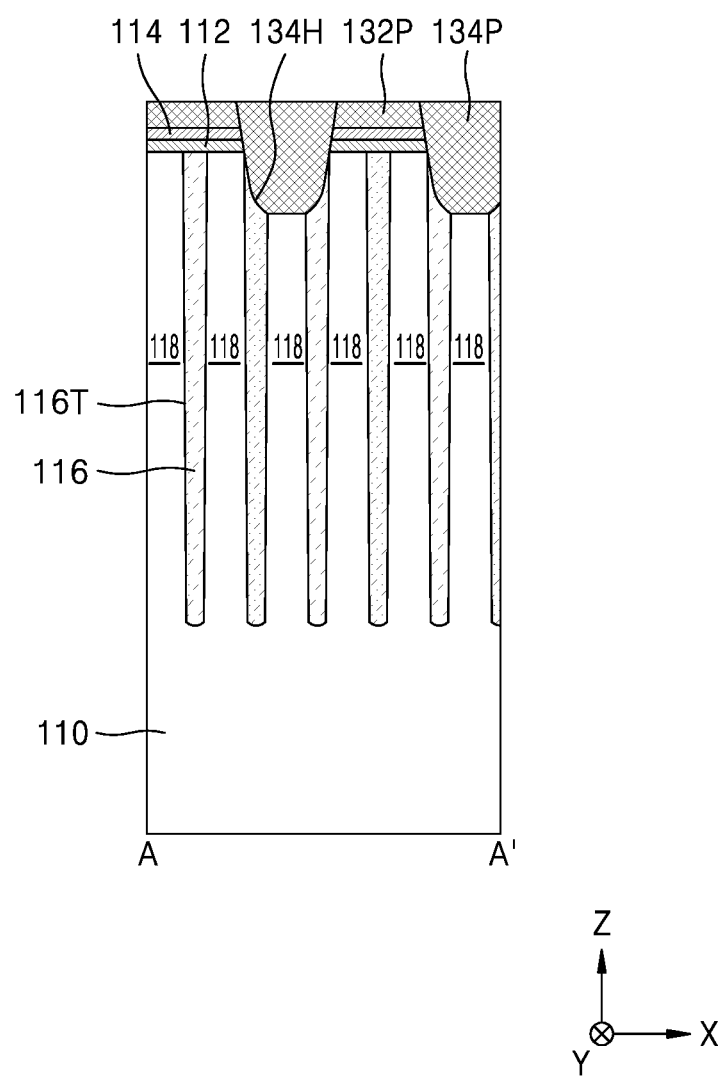
Figure 3B:
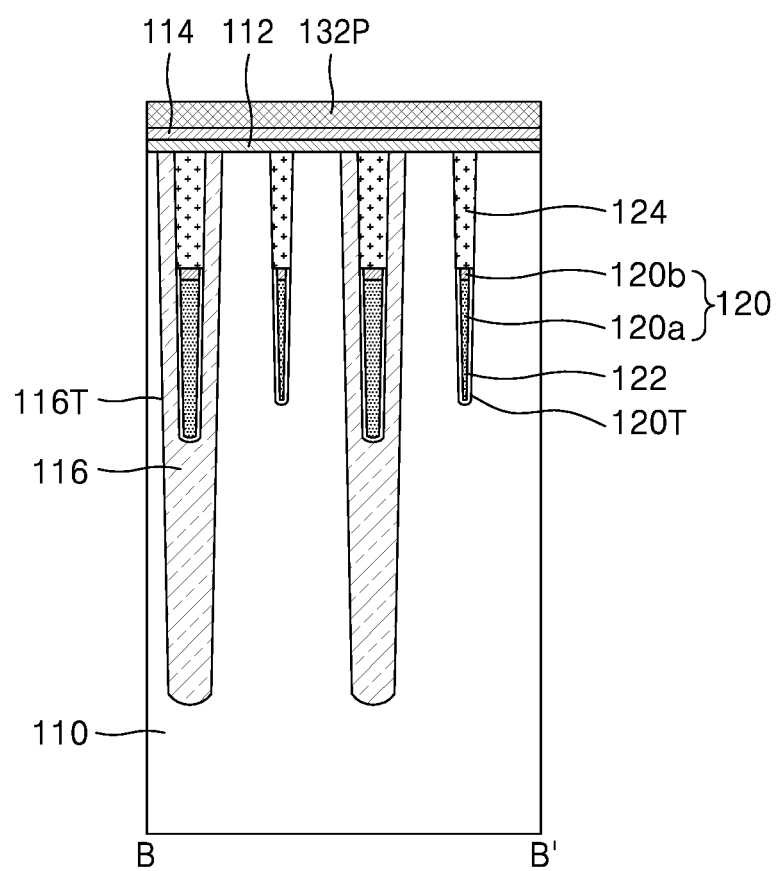

Referring to FIGS. 3A and 3B together, first and second insulating film patterns 112 and 114, which cover the element separation films 116, the plurality of active regions 118, and the plurality of buried insulating films 124, are formed. For example, each of the first and second insulating film patterns 112 and 114 may include a silicon oxide film, a silicon nitride film, a silicon oxynitride film, a metallic dielectric film, or a combination thereof. In some embodiments, the first and second insulating film patterns 112 and 114 may be formed by laminating a plurality of insulating films including the first insulating film pattern 112 and the second insulating film pattern 114. In some embodiments, the first insulating film pattern 112 may include a silicon oxide film, and the second insulating film pattern 114 may include a silicon oxynitride film.

In some embodiments, the first insulating film pattern 112 may include a non-metallic dielectric film, and the second insulating film pattern 114 may include a metallic dielectric film. For example, the first insulating film pattern 112 may include a silicon oxide film, a silicon nitride film, a silicon oxynitride film, or a combination thereof. For example, the second insulating film pattern 114 may include at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

Subsequently, a conductive semiconductor layer 132P is formed above the first and second insulating film patterns 112 and 114. Then, a direct contact hole 134H, which passes through the conductive semiconductor layer 132P and the first and second insulating film patterns 112 and 114 and exposes a source region inside the active region 118, is formed. A direct contact conductive layer 134P, which fills the direct contact hole 134H, is formed. In some embodiments, the direct contact hole 134H may extend into the active region 118, for example, into the source region.

The conductive semiconductor layer 132P may include, for example, doped polysilicon. The direct contact conductive layer 134P may include silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. In some embodiments, the direct contact conductive layer 134P may include an epitaxial silicon layer. In some embodiments, the direct contact conductive layer 134P may include a doped polysilicon.

In some embodiments, the direct contact hole 134H, which passes through the first and second insulating film patterns 112 and 114 and exposes the source region inside the active region 118, is firstly formed, and then the direct contact hole 134H is filled with the direct contact conductive layer 134P. The conductive semiconductor layer 132P, which covers the first and second insulating film patterns 112 and 114, and the direct contact conductive layer 134P may be formed together. In an exemplary embodiment, the conductive semiconductor layer 132P and the direct contact conductive layer 134P may be formed of the same material such as a doped polysilicon. For the clarity of drawing, FIG. 3A marks a boundary between the conductive semiconductor layer 132P and the direct contact conductive layer 134P.

Figure 4A:
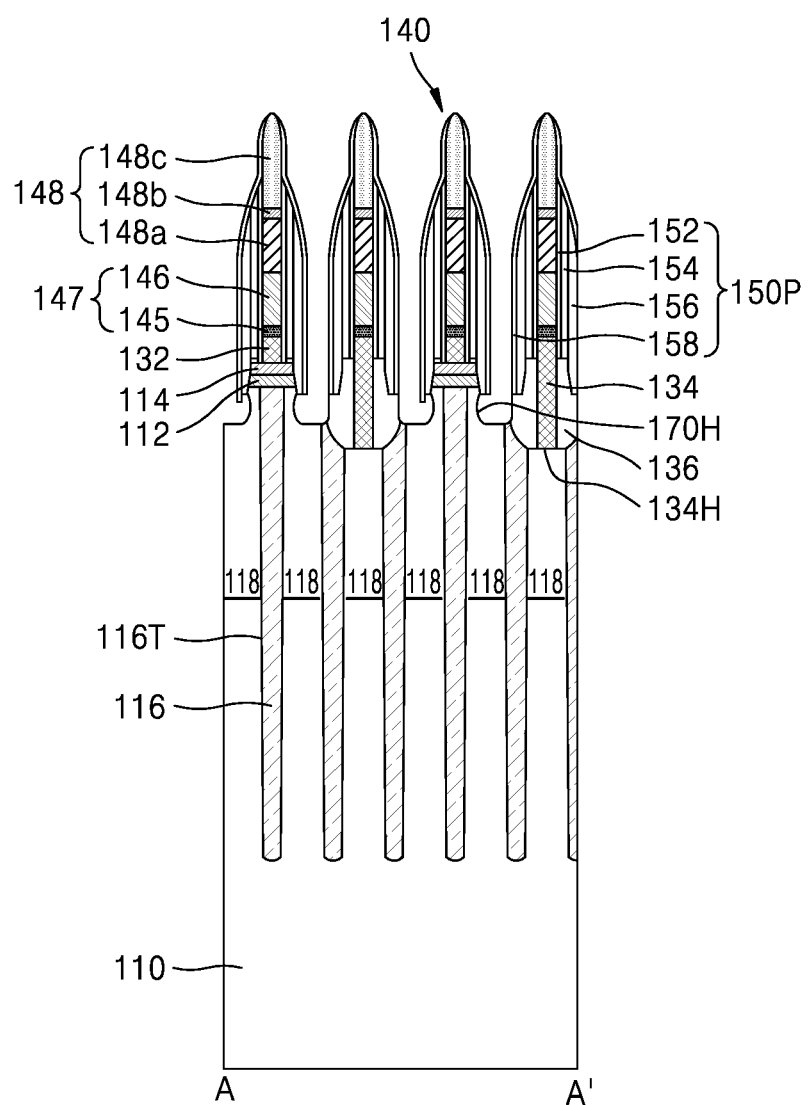
Figure 4B:
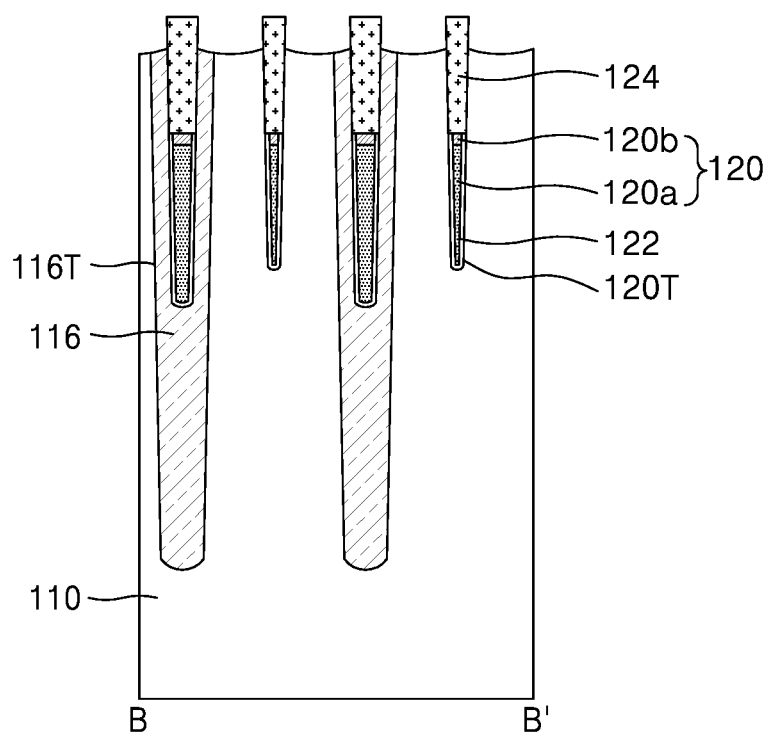

Referring to FIGS. 4A and 4B together, a metallic conductive layer and an insulating capping layer, which cover the conductive semiconductor layer 132P and the direct contact conductive layer 134P, are sequentially formed to form a bit line structure 140.

In some embodiments, the metallic conductive layer may be a laminated structure of a first metallic conductive layer and a second metallic conductive layer. The metallic conductive layer may have a double layered structure such as a laminated conductive layer structure, but this is merely an example. The inventive concept is not limited to the example. For example, the metallic conductive layer may have a single layer or a multi laminated structure including three or more layers.

In some embodiments, the insulating capping layer may have a laminated structure of a first insulating capping layer, a second insulating capping layer, and a third insulating capping layer. The insulating capping layer may have a laminated insulating layer structure including three or more layers, but this is merely an example. The inventive concept is not limited to the example. For example, the insulating capping layer may have a single layer, a double layer, or a multi laminated structure including four or more layers.

The first metallic conductive layer, the second metallic conductive layer, and the insulating capping layer may be etched to form a plurality of bit lines 147 and a plurality of insulating capping lines 148. Each of the plurality of bit lines 147 has a laminated structure of a first metallic conductive pattern 145 and a second metallic conductive pattern 146. Each bit line 147 may have a line shape extending along the second horizontal direction (Y axis). Each insulating capping line 148 is disposed on a corresponding bit line, extending along the second horizontal direction (Y axis).

In some embodiments, the first metallic conductive pattern 145 may include titanium nitride (TiN) or TSN (Ti—Si—N), and the second metallic conductive pattern 146 may include tungsten (W), or tungsten and tungsten silicide (WSix). In some embodiments, the first metallic conductive pattern 145 may serve as a diffusion barrier. In some embodiments, each of the plurality insulating capping lines 148 may have a laminated structure of a first insulating capping line 148*a*, a second insulating capping line 148*b*, and a third insulating capping line 148*c*. In some embodiments, each of the first insulating capping line 148*a*, the second insulating capping line 148*b*, and the third insulating capping line 148*c* may include a silicon nitride film.

One bit line 147 and one insulating capping line 148 that covers the one bit line 147 may constitute one bit line structure 140. The plurality of bit line structures 140, constituted by the plurality of bit lines 147 and the plurality of insulating capping lines 148, are parallel to each other. Each bit line structure 140 may extend in the second horizontal direction (Y direction) that is parallel to the main surface of the substrate 110. The plurality of bit lines 147 may constitute the plurality of bit lines BL illustrated in FIG. 1. In some embodiments, the bit line structure 140 may further include a conductive semiconductor pattern 132, which is a portion of the conductive semiconductor layer 132P (FIGS. 3A and 3B) disposed between the first metallic conductive pattern 145 and a combined structure of the first and second insulating film patterns 112 and 114.

In an etching process for forming the plurality of bit lines 147, a portion of the direct contact conductive layer 134P (FIGS. 3A and 3B) not vertically overlapping the bit line 147 is removed. Thus, a plurality of direct contact conductive patterns 134 may be formed. Here, each of the first and second insulating film patterns 112 and 114 may serve as an etch stop film during the etching process for forming the plurality of bit lines 147 and the plurality of direct contact conductive patterns 134. The plurality of direct contact conductive patterns 134 may constitute the plurality of direct contacts DC illustrated in FIG. 1. The plurality of bit lines 147 may be electrically connected to the plurality of active regions 118 via the plurality of direct contact conductive patterns 134.

In some embodiments, during a process of etching the portion of the direct contact conductive layer 134P to form the direct contact conductive pattern 134, the conductive semiconductor pattern 132 may be formed together. For example, the conductive semiconductor pattern 132 may be a portion of the conductive semiconductor layer 132P, which does not vertically overlap the direct contact hole 134H and is positioned above the first and second insulating film patterns 112 and 114. The portion of the conductive semiconductor layer 132P vertically overlaps the bit line 147. In some embodiment, the bit line 147 may serve as an etching mask to form the conductive semiconductor pattern 132. The direct contact conductive pattern 134 is a portion which vertically overlaps the direct contact hole 134H and is in contact with the active region 118. The term "contact," as used herein, refers to a direct connection (i.e., touching) unless the context indicates otherwise.

After the bit line structure 140 is formed, a buried insulating pattern 136 may be formed. The buried insulating pattern 136 fills a portion of the direct contact hole 134H from which the portion of the direct contact conductive layer 134P is removed during the process of forming the direct contact conductive pattern 134. The buried insulating pattern 136 may include, for example, a silicon nitride film.

Opposite sidewalls of each of the bit line structures 140 are covered with a preliminary insulating spacer structure 150P. Each of the plurality of preliminary insulating spacer structures 150P includes a first insulating spacer 152, a second insulating spacer 154, a third insulating spacer 156, and a fourth insulating spacer 158. In some embodiments, each of the plurality of preliminary insulating spacer structures 150P does not include one of the third insulating spacer 156 and the fourth insulating spacer 158. In some embodiments, each of the plurality of preliminary insulating spacer structures 150P may include the first insulating spacer 152, the second insulating spacer 154, and the third insulating spacer 156. In some embodiments, each of the plurality of preliminary insulating spacer structures 150P may include the first insulating spacer 152, the second insulating spacer 154, and the fourth insulating spacer 158.

In some embodiments, each of the first insulating spacer 152, the third insulating spacer 156, and the fourth insulating spacer 158 may include a nitride film. The second insulating spacer 154 may include a material having etch selectivity with respect to the first insulating spacer 152, the third insulating spacer 156, and the fourth insulating spacer 158. For example, when each of the first insulating spacer 152, the third insulating spacer 156, and the fourth insulating spacer 158 include a silicon nitride film, the second insulating spacer 154 may include an oxide film and may be removed in a subsequent process to form an air spacer.

A plurality of buried contact holes 170H are formed between the plurality of bit lines 147. An inner space of each of the plurality of buried contact holes 170H may be defined by the active region 118, the insulating spacer structure 150 that covers a sidewall of a first bit line of the two neighboring bit lines 147 and the insulating spacer structure 150 that covers a sidewall of a second bit line of the two neighboring bit lines 147.

The plurality of buried contact holes 170H may be formed by removing portions of the first and second insulating film patterns 112 and 114 and portions of the active region 118. In some embodiments, the plurality of insulating capping lines 148 and the preliminary insulating spacer structures 150P covering the opposite sidewalls of each of the plurality of bit line structures 140 may be used as etch masks. In some embodiments, the plurality of buried contact holes 170H may be formed by firstly performing an anisotropic etch process in which portions of the first and second insulating film patterns 112 and 114 and portions of the active region 118 may be removed by using, as the etch masks, the plurality of insulating capping lines 148 and the preliminary insulating spacer structures 150P covering the opposite sidewalls of each of the plurality of bit line structures 140. Then, an isotropic etch process of further removing another portion of the active region 118 may be performed, and thus, the space defined by the active region 118 may extend. For example, an undercut below the preliminary insulating spacer structures 150P may be formed using the isotropic etch process so that the space defined by the active region 118 may extend in the first horizontal direction (X direction).

Figure 5A:
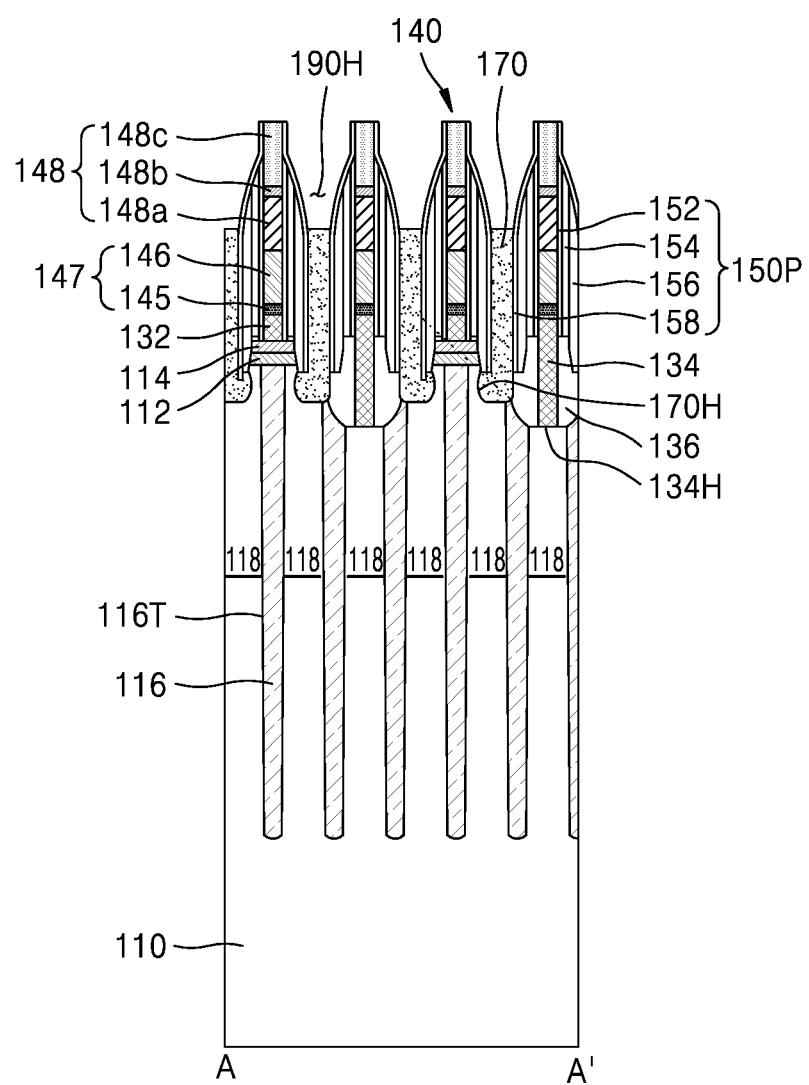
Figure 5B:
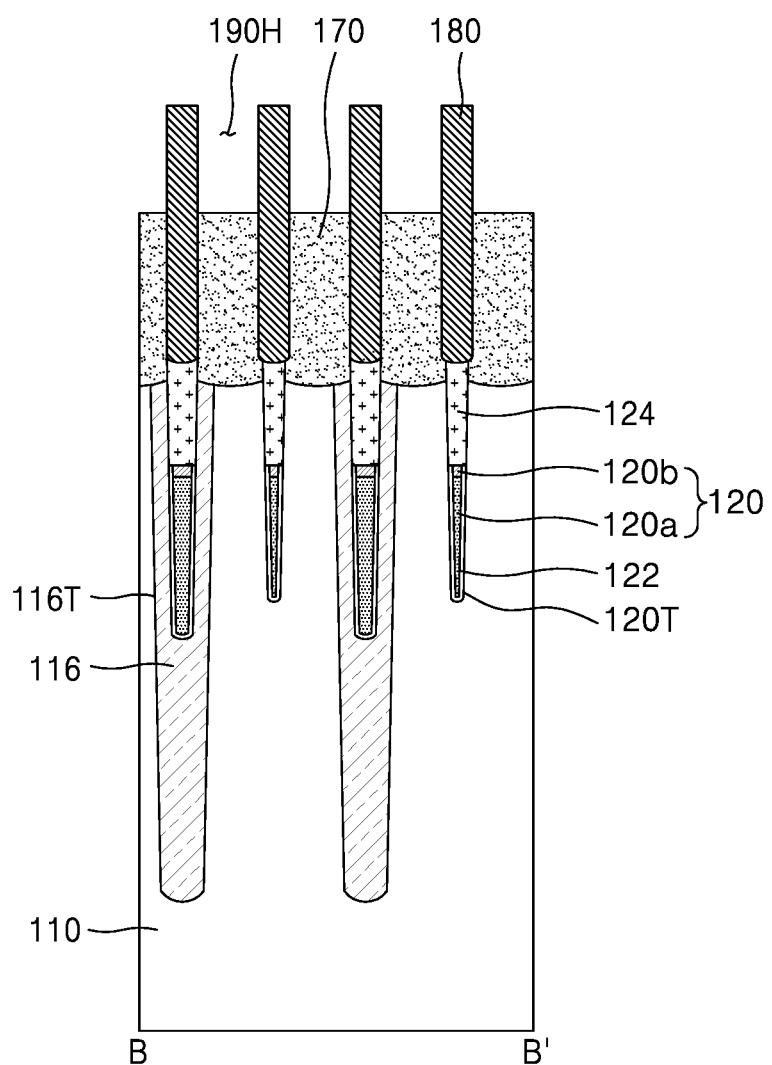

Referring to FIGS. 5A and 5B together, a plurality of buried contacts 170 and a plurality of insulating fences 180 are formed in spaces between the plurality of preliminary insulating spacer structures 150P covering the opposite sidewalls of each of the plurality of bit line structures 140. The plurality of buried contacts 170 and the plurality of insulating fences 180 may be alternately arranged, along a space between a facing pair of the preliminary insulating spacer structures 150P of the plurality of preliminary insulating spacer structures 150P covering the opposite sidewalls of the plurality of bit line structures 140. For example, the plurality of buried contacts 170 and the plurality of insulating fences 180 may be alternately arranged along the second horizontal direction (Y direction). For example, each of the plurality of buried contacts 170 may include polysilicon. For example, each of the plurality of insulating fences 180 may include a silicon nitride film.

In some embodiments, the plurality of buried contacts 170 may be arrayed in the first horizontal direction (X direction) and the second horizontal direction (Y direction). In some embodiments, the plurality of insulating fences 180 may be arrayed in the first horizontal direction (X direction) and the second horizontal direction (Y direction).

Each of the buried contacts 170 extends from above the active region 118 in the vertical direction (Z direction) perpendicular to the substrate 110. The plurality of buried contacts 170 may constitute the plurality of buried contacts BC illustrated in FIG. 1.

The plurality of buried contacts 170 are positioned in spaces defined by the plurality of insulating fences 180 and the plurality of preliminary insulating spacer structures 150P covering opposite sidewalls of the plurality of bit line structures 140. The plurality of buried contacts 170 fill some of lower portions of the spaces between the plurality of preliminary insulating spacer structures 150P covering opposite sidewalls of the plurality of bit line structures 140. For example, each buried contact 170 fills a lower portion of a space between the facing pair of preliminary insulating spacer structures 150P in the first horizontal direction (X direction) and between two neighboring insulating fences 180 in the second horizontal direction (Y direction).

Levels of top surfaces of the plurality of buried contacts 170 are lower than levels of top surfaces of the plurality of insulating capping lines 148 with respect to the vertical direction (Z direction). Top surfaces of the plurality of insulating fences 180 may be at the same level as the top surfaces of the plurality of insulating capping lines 148 with respect to the vertical direction (Z direction).

A plurality of landing pad holes 190H are defined by the plurality of insulating spacer structures 150 and the plurality of insulating fences 180. The plurality of buried contacts 170 are exposed at bottom surfaces of the plurality of landing pad holes 190H.

During a process of forming the plurality of buried contacts 170 and/or the plurality of insulating fences 180, the insulating capping line 148 included in the bit line structure 140 and a portion of an upper side of the preliminary insulating spacer structure 150P may be partially removed, and thus, a level of a top surface of the bit line structure 140 may be lowered.

Figure 6A:
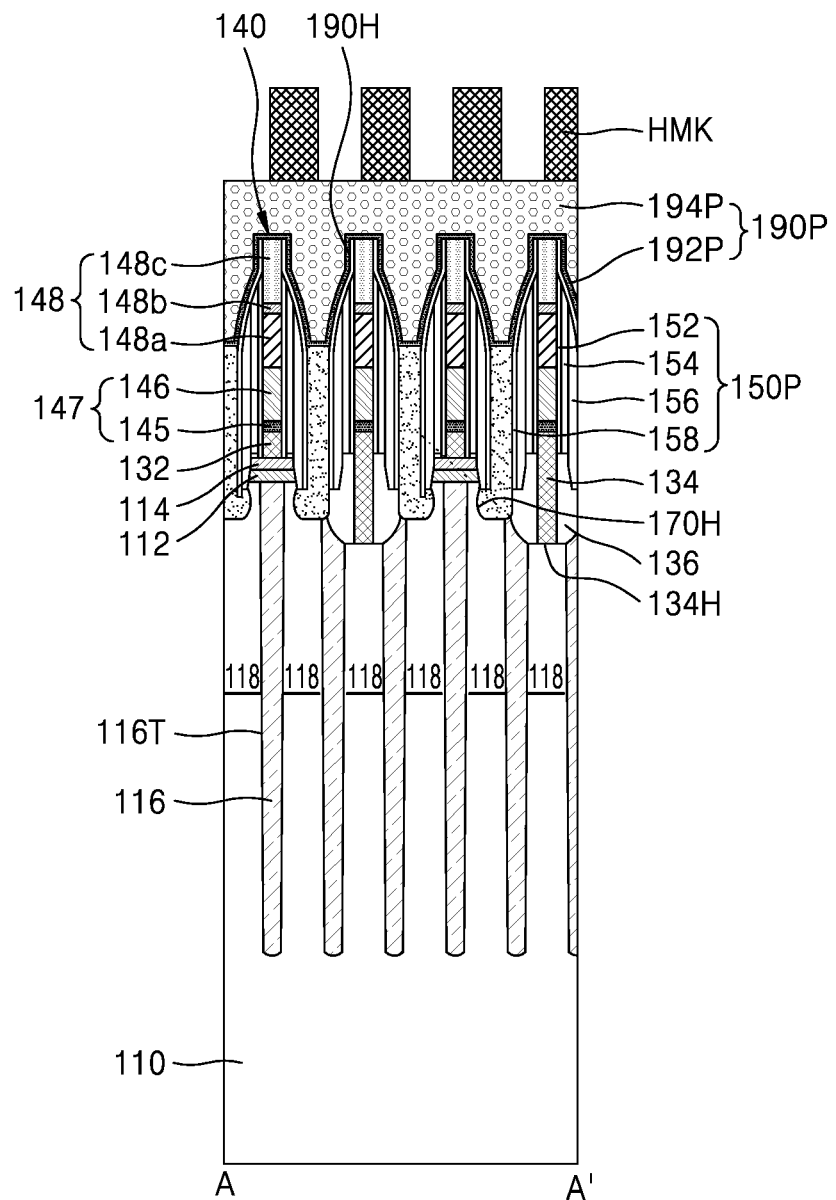
Figure 6B:
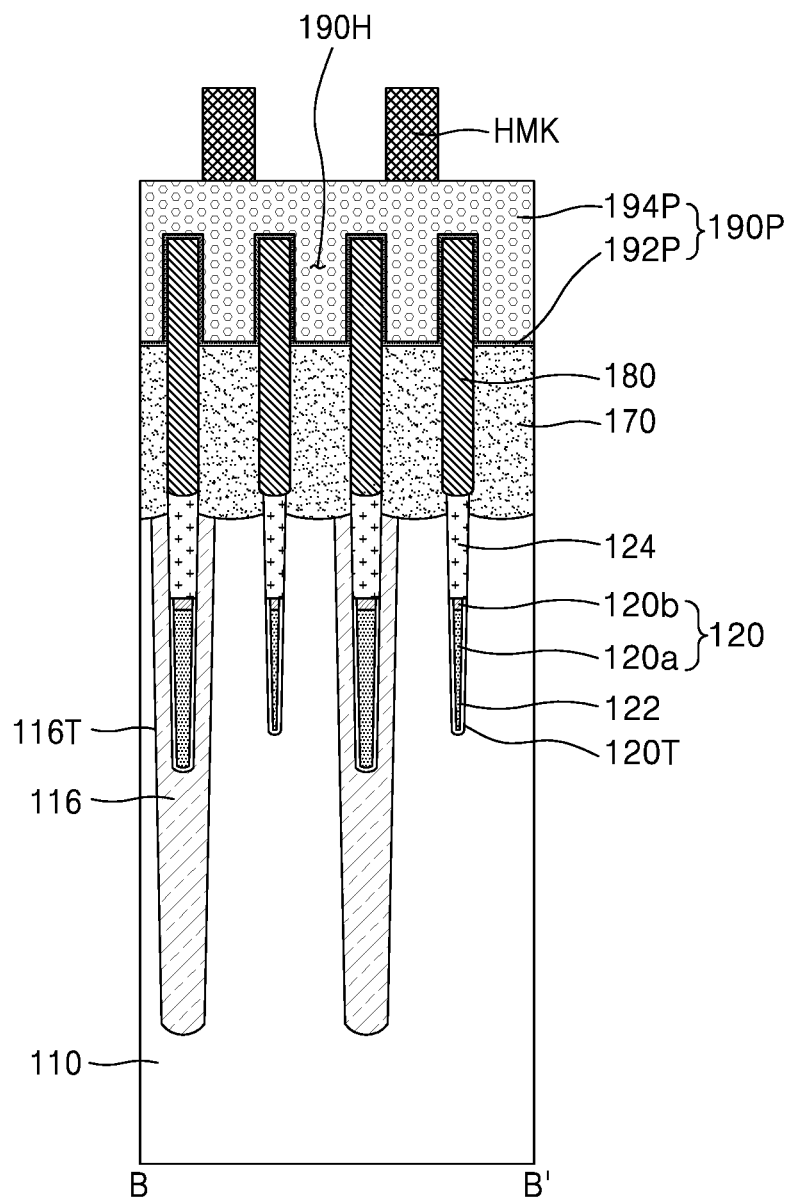

Referring to FIGS. 6A and 6B, a landing pad material layer 190P is formed, which fills the plurality of landing pad holes 190H and covers the plurality of bit line structures 140.

In some embodiments, the landing pad material layer 190P includes a conductive barrier layer 192P and a conductive pad material layer 194P on the conductive barrier layer 192P. For example, the conductive barrier layer 192P may include metal, a conductive metal nitride, or a combination thereof. In some embodiments, the conductive barrier layer 192P may include a Ti/TiN laminated structure or TiN. In some embodiments, the conductive pad material layer 194P may include tungsten (W).

In some embodiments, before the landing pad material layer 190P is formed, a metal silicide film may be formed on the plurality of buried contacts 170. The metal silicide film may be disposed between the plurality of buried contacts 170 and the landing pad material layer 190P. The metal silicide film may include cobalt silicide ($CoSi_x$), nickel silicide ($NiSi_x$), or manganese silicide ($MnSi_x$), but is not limited thereto.

A plurality of hard mask patterns HMK are formed on the landing pad material layer 190P. In some embodiment, the plurality of hard mask patterns HMK may be formed through an ArF lithography process or an extreme ultraviolet (EUV) lithography process.

Figure 7A:
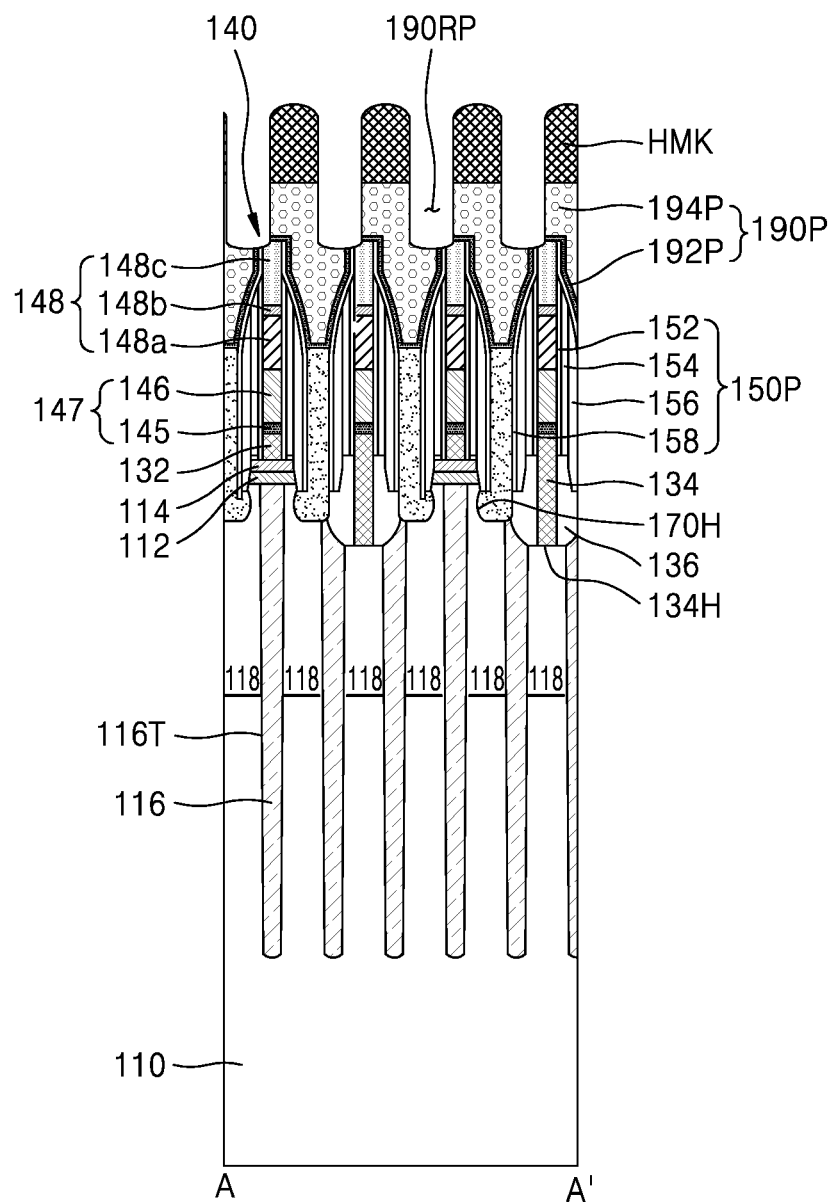
Figure 7B:
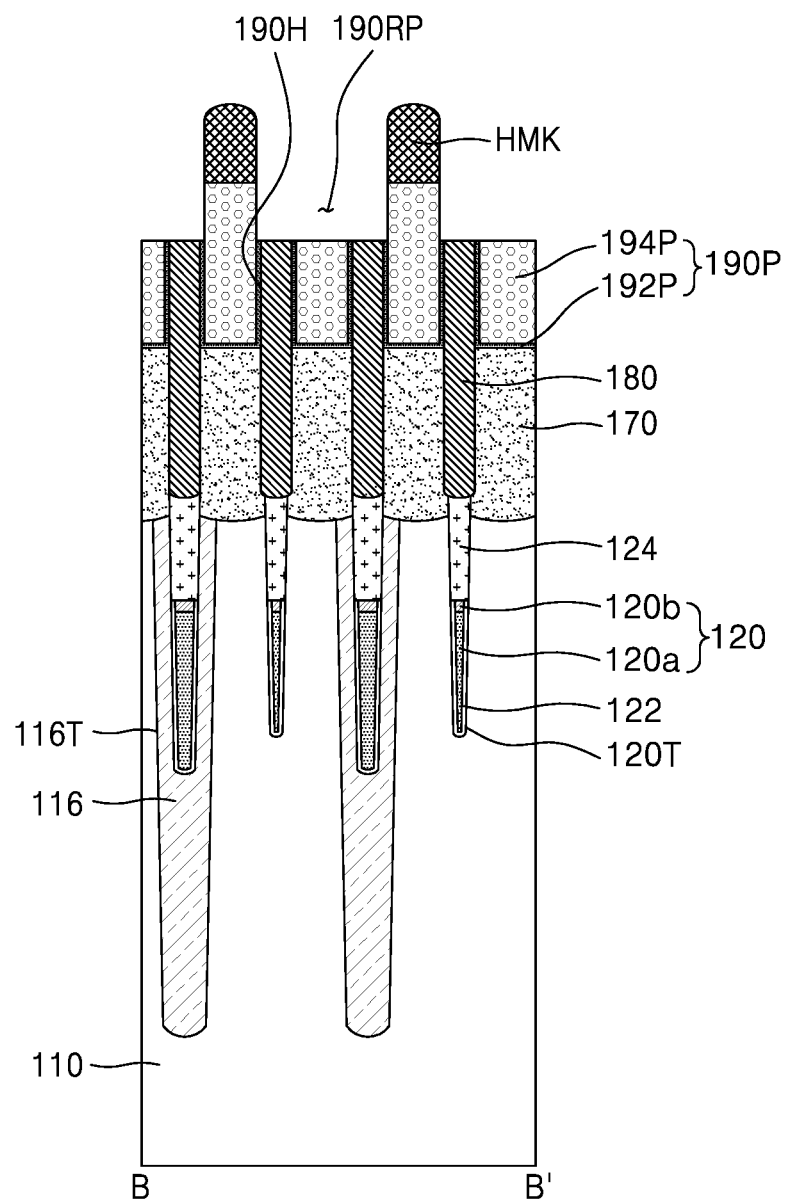

Referring to FIGS. 7A and 7B together, a first etching process, in which a portion of the landing pad material layer 190P is removed by using the plurality of hard mask patterns HMK as etch masks, may be performed to form preliminary recess portions 190RP. Each of the preliminary recess portions 190RP may be formed by removing a portion of the conductive pad material layer 194P so that the conductive barrier layer 192P is exposed or by removing a portion of the conductive pad material layer 194P and a portion of the conductive barrier layer 192P so that the preliminary insulating spacer structure 150P is exposed.

For example, the first etching process may be performed by a plasma etching method in which $CF_4$ or $SF_6$ is used as an etchant. For example, the first etching process may have high selectivity with respect to conductive materials such as metal and a metal nitride.

In some embodiments, during a time when the first etching process is performed, a portion of the landing pad material layer 190P and a portion of the preliminary insulating spacer structure 150P may be removed together with the etch masks (e.g., the hard mask patterns MK).

Figure 8A:
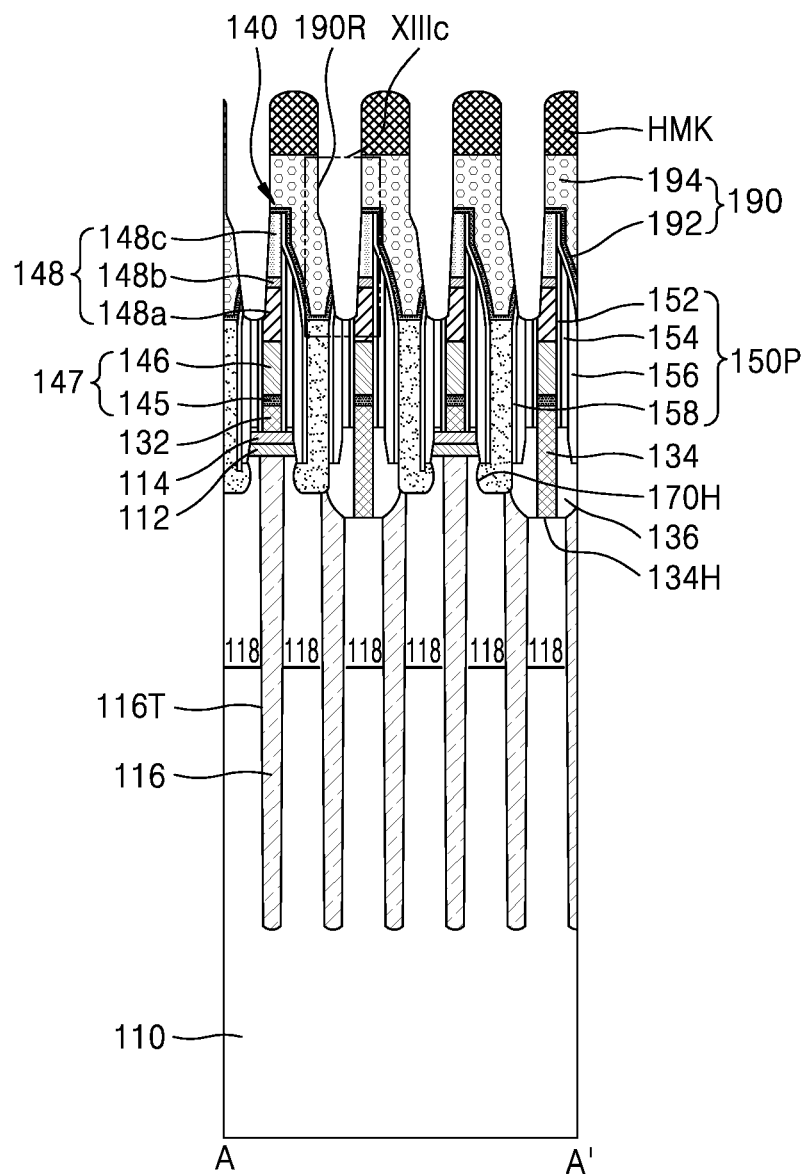
Figure 8B:
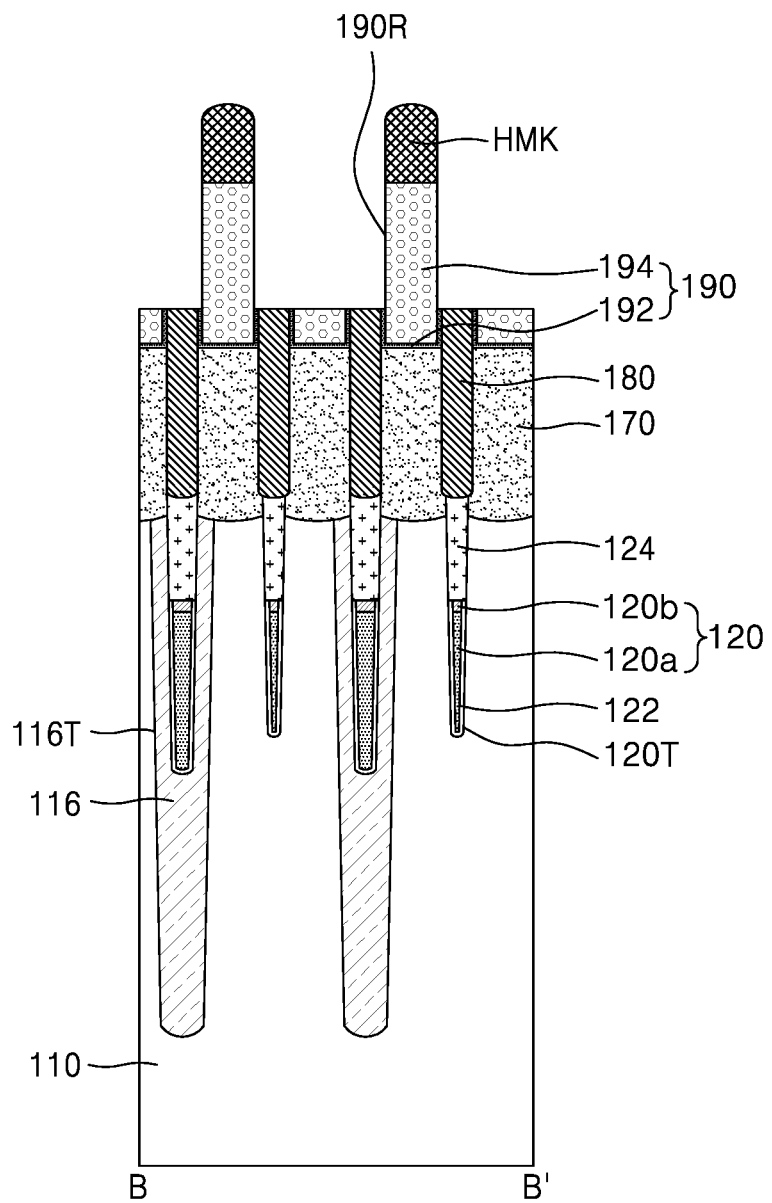
Figure 8C:
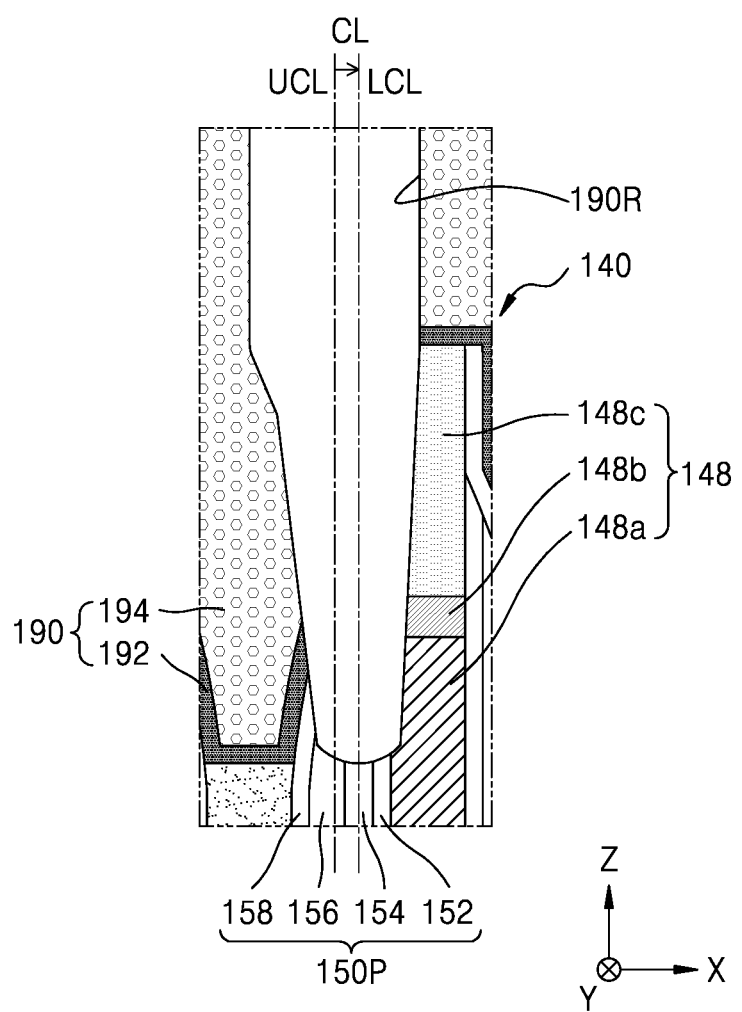

Referring to FIGS. 8A to 8C together, a second etching process and a third etching process may be performed alternately several times using the plurality of hard mask patterns HMK as the etch masks to form recess portions 190R. Each of the recess portions 190R may be formed by removing a portion of the conductive barrier layer 192P, another portion of the conductive pad material layer 194P, a portion of the fourth insulating spacer 158, and a portion of the third insulating spacer 156, so that the second insulating spacer 154 is exposed.

For example, the second etching process may be performed by a plasma etching method in which $Cl_2$, $NF_3$, $SF_6$, or a mixture thereof is used as an etchant. For example, the second etching process may have high selectivity with respect to conductive materials or semiconductor materials such as metal, a metal nitride, and silicon.

For example, the third etching process may be performed by a plasma etching method in which $C_xF_y$, $C_xH_y$, $CH_xF_y$, or a mixture thereof is used as an etchant. For example, the third etching process may have high selectivity with respect to insulating materials such as silicon nitride, silicon oxide, and silicon oxynitride.

The landing pad material layers 190P (FIGS. 7A and 7B) are divided into a plurality of segments by the recess portions 190R and formed into a plurality of landing pads 190 which fill at least some of the plurality of landing pad holes 190H. The landing pads 190 are disposed on upper surfaces of the buried contacts 170, extending above the plurality of bit line structures 140. For example, the landing pads 190 are disposed on both the upper surfaces of the buried contacts 170 and the upper surfaces of the bit line structures 140. The plurality of landing pads 190 may be spaced apart from each other with the recess portion 190R therebetween.

The plurality of landing pads 190 are positioned above the plurality of buried contacts 170 and may extend above the plurality of bit line structures 140. In some embodiments, the plurality of landing pads 190 may extend above the plurality of bit lines 147. The plurality of landing pads 190 are positioned above the plurality of buried contacts 170. Thus, the plurality of buried contacts 170 and the plurality of landing pads 190, which correspond to each other, may be electrically connected to each other. The plurality of landing pads 190 may be electrically connected to the active regions 118 via the plurality of buried contacts 170. The plurality of landing pads 190 may constitute the plurality of landing pads LP illustrated in FIG. 1. Each of the plurality of landing pads 190 may include a conductive barrier pattern 192 and a conductive pad pattern 194 on the conductive barrier pattern 192. In some embodiments, the conductive barrier pattern 192 may include a Ti/TiN laminated structure or TiN. In some embodiments, the conductive pad pattern 194 may include tungsten (W).

Each of the buried contacts 170 may be positioned between two bit line structures 140 adjacent to each other, and each of landing pads 190 may extend above one bit line structure 140 from between the two bit line structures 140 which are adjacent to each other with the buried contact 170 therebetween. Referring to FIGS. 8A and 8B, and FIG. 1, each landing pad 190 (in FIG. 1, LP) overlaps two neighboring active regions 118 (in FIG. 1, the active regions ACT). For example, each landing pad 190 overlaps a buried contact 170 (in FIG. 1, the buried contact BC) on a first active region of the two neighboring active regions and a direct contact conductive pattern 134 (in FIG. 1, the direct contact DC) on a second active region of the two neighboring active region. The buried contact 170 of the first active region does not overlap the second active region. The direct contact conductive pattern 134 that is disposed on the second active region does not overlap the first active region. The landing pad 190 may be electrically connected to the buried contact 170 that is disposed on the first active region without being electrically connected to the direct contact conductive pattern 134 that is disposed on the second active region. The direct contact conductive pattern 134 is disposed on a bit line structure 140 (in FIG. 1, the bit line BL) on the second active region 118-2 and is electrically connected thereto. The landing pad 190 overlaps the bit line structure 140 on the second active region 118-2 without being electrically connected to the bit line structure 140.

In some embodiments, the insulating fence 180 and the insulating capping line 148 may have similar etch characteristics to the third insulating spacer 156 and the fourth insulating spacer 158, and during a time when the recess portion 190R is formed, a portion of the insulating fence 180 and a portion of the insulating capping line 148 may also be removed together.

The recess portion 190R may be formed by alternately performing the second etching process and the third etching process. Thus, the recess portion 190R may be bent from an upper side of the recess portion 190R to a lower side of the recess portion 190R, so that the recess portion 190R extends, along between the landing pad 190 and the preliminary insulating spacer structure 150P, with a slope relative to the first horizontal direction (X direction) and the vertical direction (Z direction). For example, the recess portion 190R may be bent from the landing pad 190 toward the insulating capping line 148 of the bit line structure 140, so that the recess portion 190R extends with a slope relative to the first horizontal direction (X direction) and the vertical direction (Z direction). For example, the recess portion 190R has a sidewall extending along a sidewall of the landing pad 190 toward the substrate 110. As extending toward the substrate 110, the sidewall of the recess portion 190R is closer to a sidewall of the bit line structure 140. The recess portion 190R is defined by the sidewall of the landing pad 190 and the sidewall of the bit line structure 140.

Referring to FIG. 8C, a first vertical line UCL that extends along a center of an upper end of the recess portion 190R with respect to the first horizontal direction (X direction) and a second vertical line LCL that extends along a center of a lower end of the recess portion 190R with respect to the first horizontal direction (X direction) may be offset by a center shift distance CL from each other in the first horizontal direction (X direction). In some embodiment, the recess portion 190R extends from an upper end of the recess portion 190R toward a lower end of the recess portion 190R. The recess portion 190R has the center shift distance CL in the first horizontal direction (X direction) from the landing pad 190 toward the bit line structure 140, and may be bent with a slope relative to the first horizontal direction (X direction) and the vertical direction (Z direction). For example, the recess portion 190R may have a sidewall extending along a sidewall of the landing pad 190 toward the substrate 110. As extending toward the substrate 110, the sidewall of the recess portion 190R is closer to a sidewall of the bit line structure 140. The recess portion 190R is defined by the sidewall of the landing pad 190 and the sidewall of the bit line structure 140.

In some embodiments, the center of the lower end of the recess portion 190R and a center of an upper end of the second insulating spacer 154 may be aligned with each other in the vertical direction (Z direction).

Referring to FIG. 8B, the recess portion 190R may have a bottom surface of which at least a portion is substantially flat in the second horizontal direction (Y direction). Between the two landing pads 190 spaced apart from each other in the second horizontal direction (Y direction) with the recess portion 190R therebetween, the recess portion 190R may have the bottom surface of which at least a portion is substantially flat in the second horizontal direction (Y direction). In some embodiments, the recess portion 190R between the two landing pads 190 may have a substantially flat bottom surface. Because the second etching process and the third etching process are performed alternately several times during the process of forming the recess portion 190R, a portion of the insulating fence 180 and a portion of the landing pad 190 exposed by the bottom surface of the preliminary recess portions 190RP of FIG. 7B may be etched at a substantially similar rate so that the bottom surface of the recess portion 190R may be substantially flat in the second horizontal direction (Y direction). For example, at least a portion of a top surface of a portion of the insulating fence 180 exposed at the bottom surface of the recess portion 190R may be at substantially the same level as a top surface of a portion of the landing pad material layer 190P along the second horizontal direction (Y direction) with respect to the vertical direction (Z direction). The portion of the landing pad material layer 190P may be left between two insulating fences 180 after the landing pad 190 is formed from the landing pad material layer 190P of FIG. 7B. In some embodiments, a lower portion of a side surface of the conductive pad pattern 194, which is positioned below the hard mask pattern HMK, may be covered with a portion of the insulating fence 180.

Figure 9:
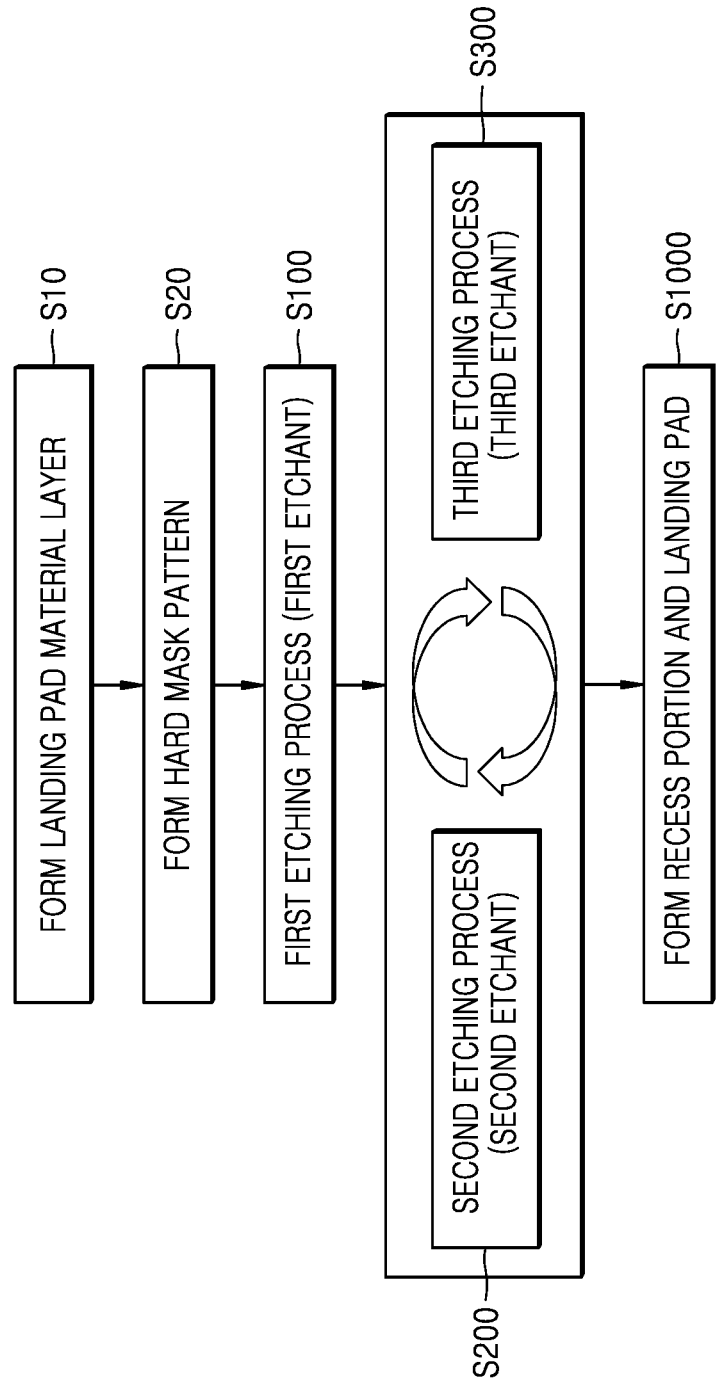
FIG. 9 is a flow chart of a manufacturing method of a semiconductor device according to embodiments.

FIG. 9 is a flow chart of a manufacturing method of a semiconductor device according to embodiments.

Referring to FIGS. 6A to 9 together, the landing pad material layer 190P is formed, which fills the plurality of landing pad holes 190H and covers the plurality of bit line structures 140 (S10). The landing pad material layer 190P includes the conductive barrier layer 192P and the conductive pad material layer 194P on the conductive barrier layer 192P. For example, the conductive barrier layer 192P may include metal, a conductive metal nitride, or a combination thereof. In some embodiments, the conductive barrier layer 192P may include a Ti/TiN laminated structure or TiN. In some embodiments, the conductive pad material layer 194P may include tungsten (W).

The plurality of hard mask patterns HMK are formed on the landing pad material layer 190P (S20). In some embodiment, the plurality of hard mask patterns HMK may be formed through an ArF lithography process or an EUV lithography process.

A first etching process (S100), in which a portion of the landing pad material layer 190P is removed by using the plurality of hard mask patterns HMK as etch masks, is performed to form the preliminary recess portions 190RP. Each of the preliminary recess portions 190RP may be formed by removing a portion of the conductive pad material layer 194P so that the conductive barrier layer 192P is exposed or by removing a portion of the conductive pad material layer 194P and a portion of the conductive barrier layer 192P so that the preliminary insulating spacer structure 150P is exposed.

For example, the first etching process (S100) may be performed by a plasma etching method in which $CF_4$ or $SF_6$ is used as an etchant. For example, the first etching process (S100) may have high selectivity with respect to conductive materials such as metal and a metal nitride. In some embodiments, the first etching process may have highest selectivity with respect to tungsten (W).

After the preliminary recess portions 190RP are formed, a second etching process (S200) and a third etching process (S300) are performed alternately several times using the plurality of hard mask patterns HMK as the etch masks, and thus, the recess portions 190R and the plurality of landing pads 190, which are spaced apart from each other with the recess portions 190R therebetween, are formed (S1000). Each of the recess portions 190R may be formed by removing another portion of the landing pad material layer 190P, a portion of the fourth insulating spacer 158, and a portion of the third insulating spacer 156, so that the second insulating spacer 154 is exposed.

For example, the second etching process (S200) may be performed by a plasma etching method in which $Cl_2$, $NF_3$, $SF_6$, or a mixture thereof may be used as an etchant. In some embodiments, the second etching process (S200) may be performed by a plasma etching method in which a mixture of $Cl_2$ and $NF_3$ may be used as an etchant. For example, the second etching process (S200) may have high selectivity with respect to conductive materials or semiconductor materials such as metal, a metal nitride, and silicon. In some embodiments, the second etching process (S200) may have highest selectivity with respect to Ti/TiN.

For example, the third etching process (S300) may be performed by a plasma etching method in which $C_xF_y$, $C_xH_y$, $CH_xF_y$, or a mixture thereof may be used as an etchant. In some embodiments, the third etching process (S300) may be performed by an etching method in which a mixture of $CHF_3$ and Ar is used as an etchant. For example, the third etching process (S300) may have high selectivity with respect to insulating materials such as silicon nitride, silicon oxide, and silicon oxynitride. In some embodiments, the third etching process (S300) may have highest selectivity with respect to silicon nitride.

In some embodiments, the recess portion 190R may be formed by alternately performing the second etching process (S200) and the third etching process (S300). For example, the number of times of performing the second etching process (S200) may be equal to the number of times of performing the third etching process (S300). For example, the second etching process (S200) may be performed first, and then the third etching process (S300) may be performed. Additionally, the second etching process (S200) and the third etching process (S300) may be repeatedly performed to form the recess portion 190R.

In other embodiments, the recess portion 190R may be formed by alternately performing the second etching process (S200) and the third etching process (S300) such that the number of times of performing the second etching process (S200) may be greater by one than the number of times of performing the third etching process (S300). For example, the second etching process (S200) may be performed first, and then the third etching process (S300) may be performed. Additionally, the second etching process (S200) and the third etching process (S300) may be repeatedly performed, and finally, the second etching process (S200) may be performed more. As a result, the recess portion 190R may be formed.

In other embodiments, the recess portion 190R may be formed by alternately performing the third etching process (S300) and the second etching process (S200) such that the number of times of performing the third etching process (S300) may be greater by one than the number of times of performing the second etching process (S200). For example, the third etching process (S300) may be performed first, and then the second etching process (S200) may be performed. Additionally, the third etching process (S300) and the second etching process (S200) may be repeatedly performed, and finally, the third etching process (S300) may be performed more. As a result, the recess portion 190R may be formed.

In some embodiments, an execution time of the second etching process (S200), which is performed first in the second etching processes (S200) performed several times, may be longer than an execution time of the second etching process (S200), which is performed subsequently. In other embodiments, an execution time of the third etching process (S300), which is performed first in the third etching processes (S300) performed several times, may be longer than an execution time of the third etching process (S300), which is performed subsequently.

An upper portion of the recess portion 190R may be mainly formed by performing the first etching process (S100), and a lower portion of the recess portion 190R may be mainly formed by alternately performing the second etching process (S200) and the third etching process (S300) several times. In this specification, the upper portion of the recess portion 190R may refer to a portion between the two neighboring landing pads 190, and the lower portion of the recess portion 190R may refer to a portion between one landing pad 190 and the bit line structure 140, which is spaced apart from and adjacent to the one landing pad 190.

When the first etching process (S100) is performed, a portion of the landing pad material layer 190P is mainly removed toward the substrate 110 in the vertical direction (Z direction) along spaces between the plurality of hard mask patterns HMK, and the upper portion of the recess portion 190R, which corresponds to the preliminary recess portion 190RP, is formed. When the second etching process (S200) and the third etching process (S300) are alternately performed several times, another portion of the landing pad material layer 190P and a portion of the preliminary insulating spacer structure 150P are removed along a boundary surface between the landing pad material layer 190P and the preliminary insulating spacer structure 150P, and thus, the lower portion of the recess portion 190R is formed.

A width, in the first horizontal direction (X direction), of the lower portion of the recess portion 190R is smaller than a width, in the first horizontal direction (X direction), of the upper portion of the recess portion 190R. The width of the recess portion 190R with respect to the first horizontal direction (X direction) may decrease from an upper end of the recess portion 190R toward a lower end of the recess portion 190R. For example, the width of the upper portion of the recess portion 190R may be constant along the vertical direction (Z direction), and the width of the lower portion of the recess portion 190R may decrease toward the substrate 110 along the vertical direction.

The upper portion of the recess portion 190R, which is the portion between the two neighboring landing pads 190, extends toward the substrate 110 in the vertical direction (Z direction). The lower portion of the recess portion 190R, which is the portion between one landing pad 190 and the bit line structure 140 and which is spaced apart from and adjacent to the one landing pad 190, may be bent from the one landing pad 190 toward the bit line structure 140, which is spaced apart from and adjacent to the one landing pad 190, so that the lower portion of the recess portion 190R extends toward the substrate 110 with a slope relative to the first horizontal direction (X direction) and the vertical direction (Z direction). For example, the lower portion of the recess portion 190R has a sidewall extending along a sidewall of the landing pad 190 toward the substrate 110. In a direction extending toward the substrate 110, the sidewall of the recess portion 190R gets closer to a sidewall of the bit line structure 140. The recess portion 190R is defined by the sidewall of the landing pad 190 and the sidewall of the bit line structure 140.

The center, with respect to the first horizontal direction (X direction), of the upper end of the recess portion 190R formed by performing the first etching process (S100) and the center of the upper end of the second insulating spacer 154 are not aligned with each other in the vertical direction (Z direction) but may be shifted a center shift distance CL from each other. For example, the center, in the first horizontal direction (X direction), of the upper end of the recess portion 190R and the center, in the first horizontal direction (X direction), of the upper end of the second insulating spacer 154, when viewed in a top down view, are spaced apart from each other in the first horizontal direction (X direction). The center, with respect to the first horizontal direction (X direction), of the lower end of the recess portion 190R formed by alternately performing the second etching process (S200) and the third etching process (S300) several times and the center of the upper end of the second insulating spacer 154 may be aligned with each other in the vertical direction (Z direction).

The center shift distance CL may be determined according to a ratio of the sum of execution times of the third etching processes (S300) performed several times to the sum of execution times of the second etching processes (S200) performed several times. As the sum of execution times of the third etching processes (S300) performed several times increases, the center shift distance CL may increase. As the sum of execution times of the third etching processes (S300) performed several times decreases, the center shift distance CL may decrease. By adjusting the ratio of the sum of execution times of the third etching processes (S300) performed several times to the sum of execution times of the second etching processes (S200) performed several times, the center of the lower end of the recess portion 190R with respect to the first horizontal direction (X direction) and the center of the upper end of the second insulating spacer 154 may be aligned with each other in the vertical direction (Z direction).

The plurality of landing pads 190 may be spaced apart from each other with the recess portions 190R therebetween. The lower portion of the recess portion 190R, which is the portion between one landing pad 190 and the bit line structure 140 and which is spaced apart from and adjacent to the one landing pad 190, may be bent from the one landing pad 190 toward the bit line structure 140, which is spaced apart from and adjacent to the one landing pad 190, so that the lower portion of the recess portion 190R extends toward the substrate 110 with a slope relative to the first horizontal direction (X direction) and the vertical direction (Z direction). For example, the lower portion of the recess portion 190R has a sidewall extending along a sidewall of the landing pad 190 toward the substrate 110. In a direction extending toward the substrate 110, the sidewall of the recess portion 190R gets closer to a sidewall of the bit line structure 140. The recess portion 190R is defined by the sidewall of the landing pad 190 and the sidewall of the bit line structure 140. Thus, even though the width of the lower portion of the landing pad 190 covering the sidewall of the bit line structure 140, that is, the width of a neck of the landing pad 190 with respect to the first horizontal direction (X direction) increases, a gap between the two neighboring landing pads 190 may be secured.

Figure 10A:
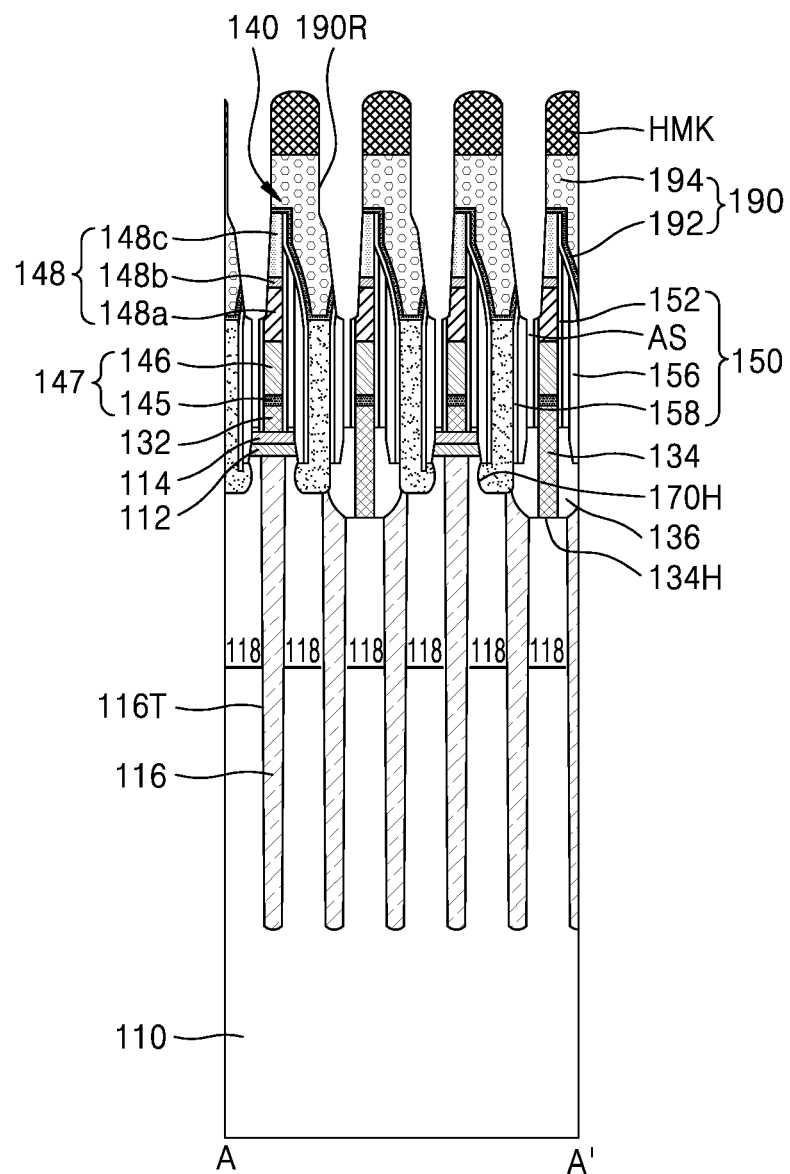
Figure 10B:
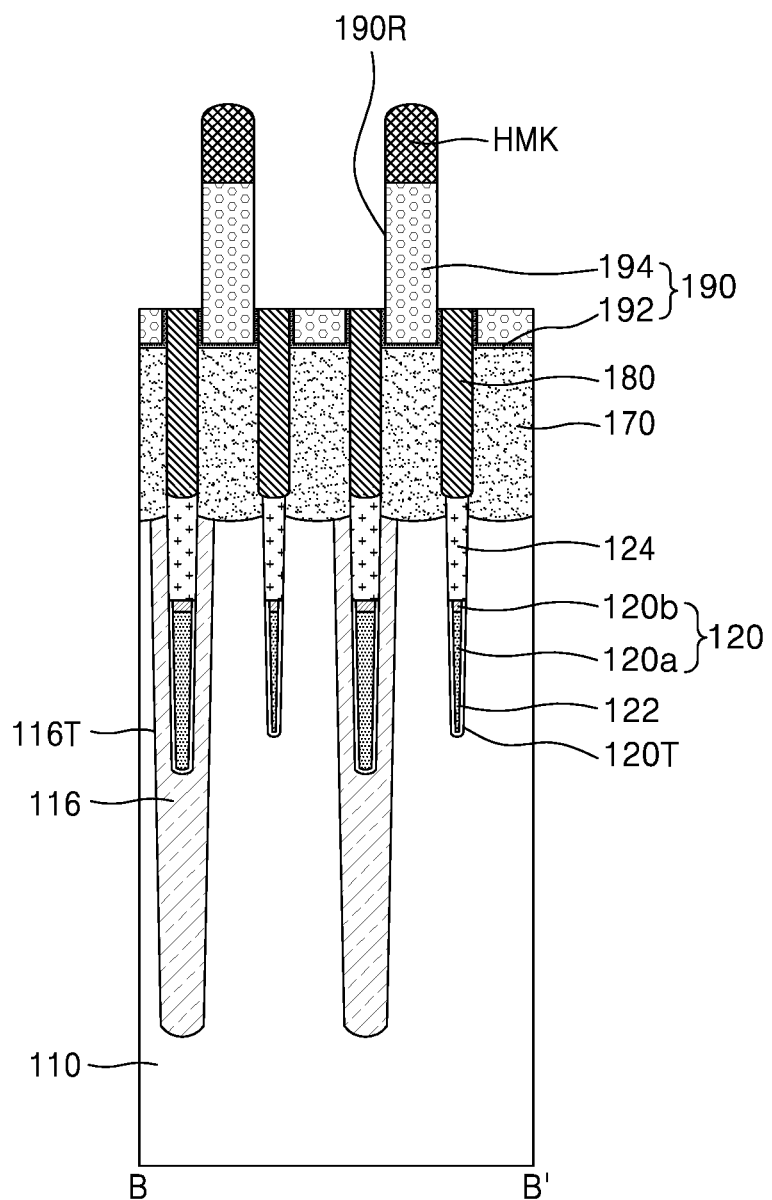

Referring to FIGS. 8A, 8B, 10A, and OB together, second insulating spacers 154 are removed through the recess portions 190R, and thus, a plurality of insulating spacer structures 150 respectively having air spacers AS are formed.

Before the second insulating spacers 154 are removed or after the second insulating spacers 154 are removed, the plurality of hard mask patterns HMK may be removed.

The recess portion 190R extends, toward the substrate 110, from the upper end of the recess portion 190R to the lower end of the recess portion 190R. The recess portion 190R has the center shift distance CL in the first horizontal direction (X direction) from the landing pad 190 toward the bit line structure 140, and is bent so that the recess portion 190R extends with a slope relative to the first horizontal direction (X direction) and the vertical direction (Z direction). For example, the recess portion 190R may have a sidewall extending along a sidewall of the landing pad 190 toward the substrate 110. As extending toward the substrate 110, the sidewall of the recess portion 190R is closer to a sidewall of the bit line structure 140. The recess portion 190R is defined by the sidewall of the landing pad 190 and the sidewall of the bit line structure 140. Thus, the center of the lower end of the recess portion 190R may be aligned with the center of the upper end of the second insulating spacer 154 in the vertical direction (Z direction).

For example, the second insulating spacer 154 is exposed at the bottom surface of the recess portion 190R, and the center of the bottom surface of the recess portion 190R and the center of the upper end of the second insulating spacer 154 are aligned with each other in the vertical direction (Z direction). Thus, the second insulating spacer 154 may be smoothly removed through the recess portion 190R. As a result, an air spacer AS may be formed to reduce parasitic capacitance between a bit line 147 and a buried contact 170, for example, spaced apart from each other in the first horizontal direction (X direction).

Each of the plurality of insulating spacer structures 150 includes the first insulating spacer 152, the third insulating spacer 156, and the fourth insulating spacer 158. The air spacer AS is positioned between the first insulating spacer 152 and the third insulating spacer 156. In some embodiments, each of the plurality of insulating spacer structures 150 does not include one of the third insulating spacer 156 and the fourth insulating spacer 158. For example, each of the plurality of insulating spacer structures 150 may include the first insulating spacer 152 and the third insulating spacer 156. The air spacer AS may be positioned between the first insulating spacer 152 and the third insulating spacer 156. Alternatively, for example, each of the plurality of insulating spacer structures 150 may include the first insulating spacer 152 and the fourth insulating spacer 158. The air spacer AS may be positioned between the first insulating spacer 152 and the fourth insulating spacer 158.

Figure 11A:
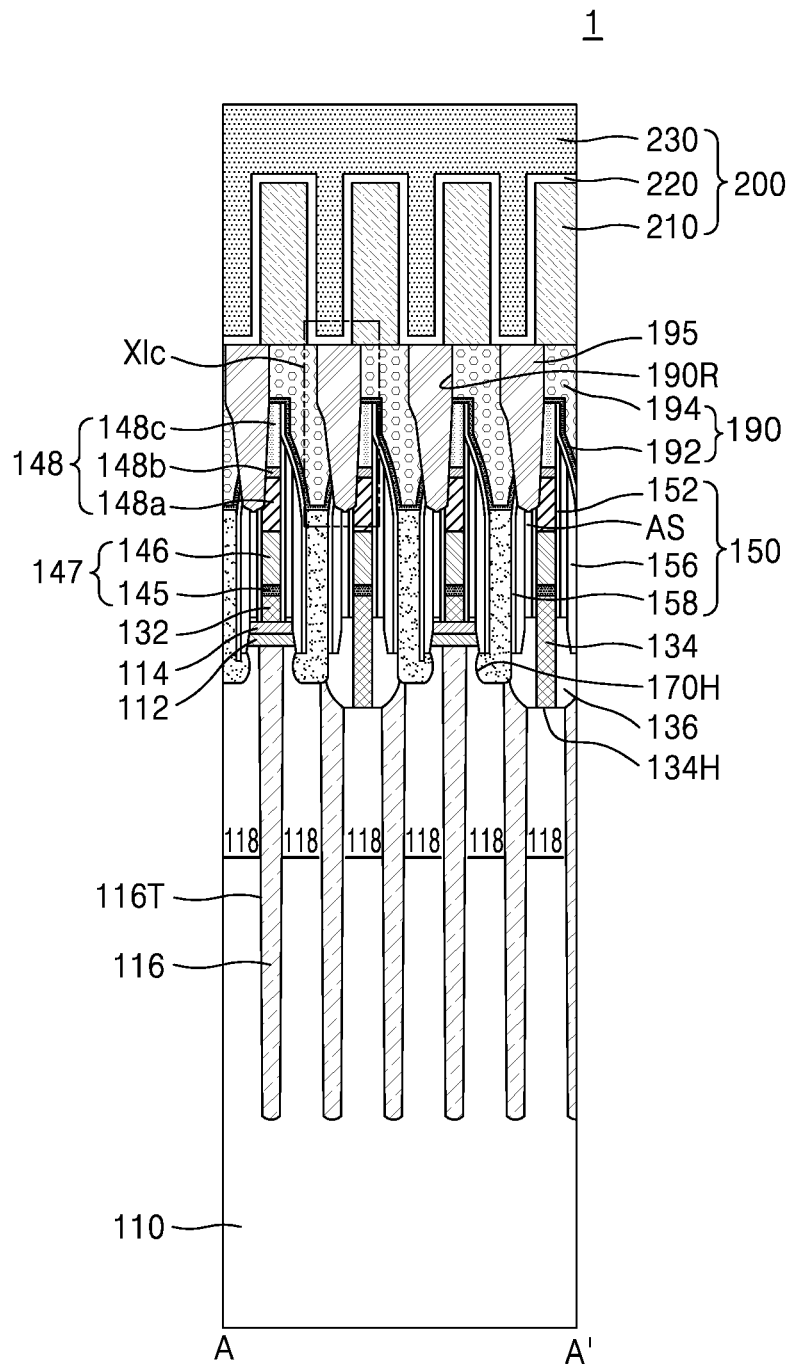
FIGS. 11A to 11D are cross-sectional views showing a semiconductor device according to embodiments.
Figure 11A:
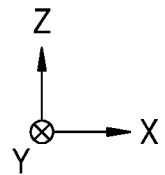
Figure 11B:
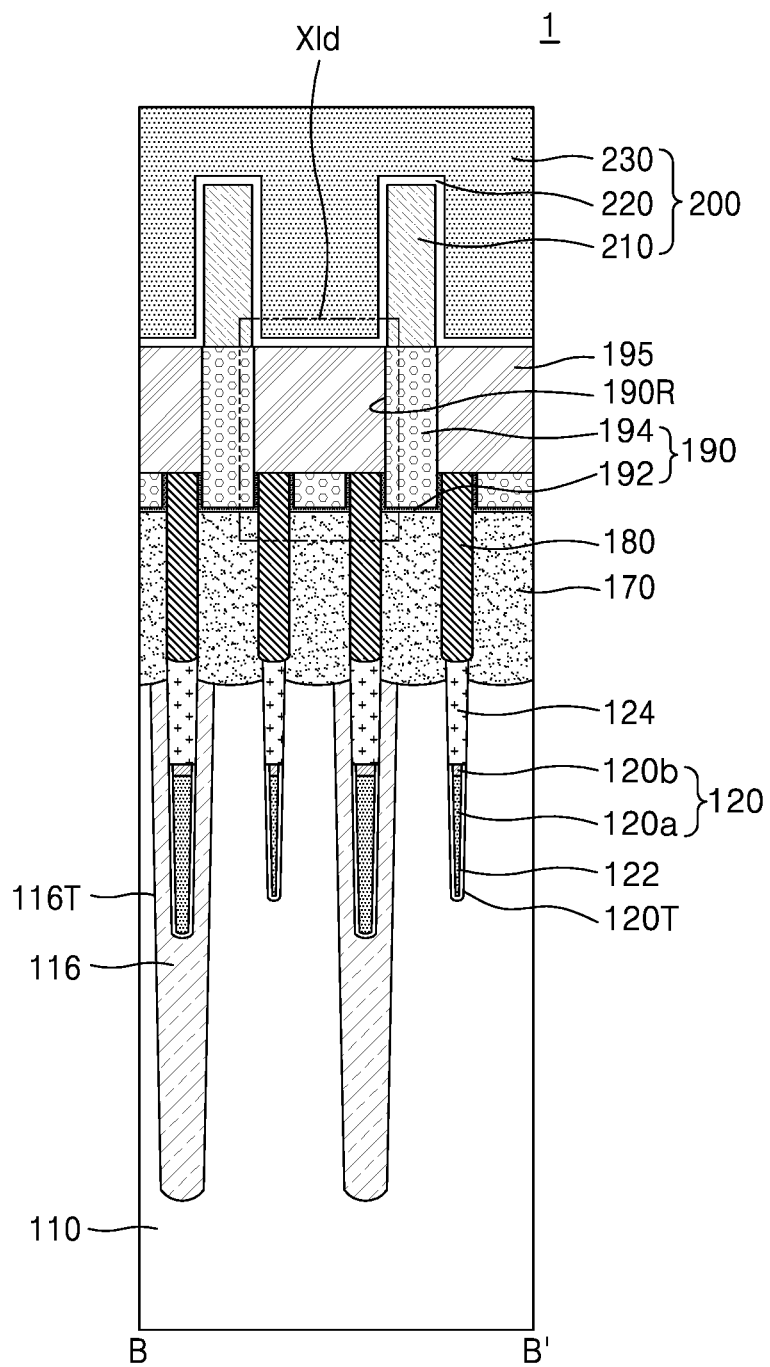
Figure 11B:
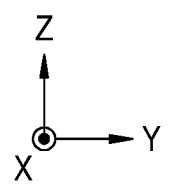
Figure 11C:
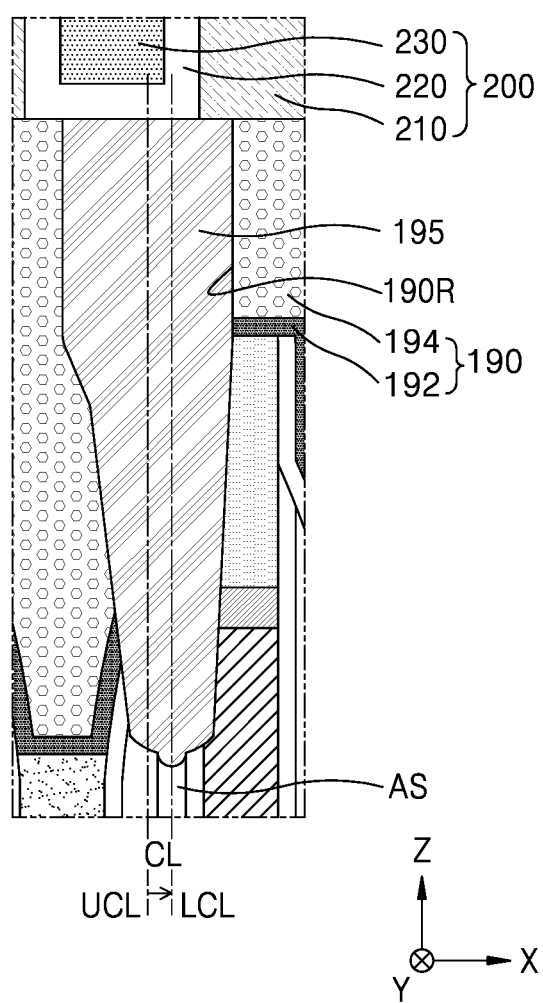
Figure 11D:
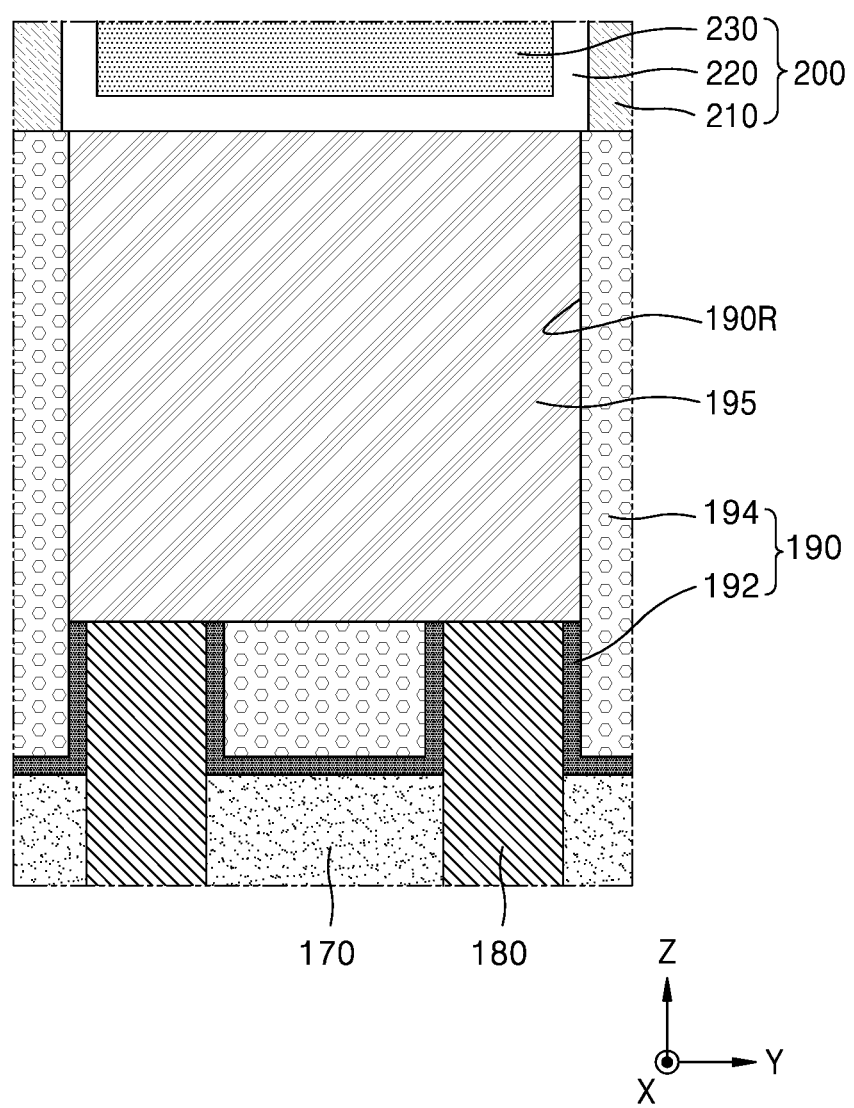

FIGS. 11A to 11D are cross-sectional views showing a semiconductor device according to embodiments. FIG. 11A is a cross-sectional view taken along line A-A' of FIG. 1, and FIG. 11B is a cross-sectional view taken along line B-B' of FIG. 1. FIG. 11C is an enlarged cross-sectional view of XIc of FIG. 11A, and FIG. 11D is an enlarged cross-sectional view of Xid of FIG. 11B.

Referring to FIGS. 11A to 11D together, an insulating structure 195, which fills the recess portion 190R, is formed, and then, a plurality of lower electrodes 210, a capacitor dielectric film 220, and an upper electrode 230 are sequentially formed on the plurality of landing pads 190. As a result, a semiconductor device 1 including a plurality of capacitor structures 200 may be formed.

In some embodiments, the insulating structure 195 may serve as an interlayer insulating layer and an etch stop film. For example, the interlayer insulating layer may include an oxide film, and the etch stop film may include a nitride film.

The plurality of the lower electrodes 210 are disposed on the plurality of landing pads 190, respectively, and are electrically connected thereto, respectively. The capacitor dielectric film 220 conformally covers the plurality of the lower electrodes 210. The upper electrode 230 covers the capacitor dielectric film 220. The upper electrode 230 is spaced apart from the lower electrodes 210 with the capacitor dielectric film 220 therebetween. The capacitor dielectric film 220 and the upper electrode 230 may be integrated with each other to cover the plurality of lower electrodes 210 in a certain region, for example, in one memory cell region CR. The plurality of lower electrodes 210 may constitute the plurality of storage nodes SN illustrated in FIG. 1.

Each of the plurality of lower electrodes 210 may have a solid column shape of a pillar shape with a circular horizontal cross-section, but is not limited thereto. In some embodiments, each of the plurality of lower electrodes 210 may have a cylindrical shape with a closed lower portion. In some embodiments, the plurality of lower electrodes 210 may be arranged in a honeycomb shape in which the lower electrodes 210 are arrayed in a zigzag manner in the first horizontal direction (X direction) or the second horizontal direction (Y direction). In other embodiments, the plurality of lower electrodes 210 may be arranged in a matrix form in which the lower electrodes 210 are arrayed in the first horizontal direction (X direction) and the second horizontal direction (Y direction). The lower electrode 210 may include, for example, silicon doped with impurities, metal such as tungsten or copper, or a conductive metal compound such as titanium nitride. Although not separately illustrated, the semiconductor device 1 may further include at least one support pattern that is in contact with sidewalls of the plurality of the lower electrodes 210.

The capacitor dielectric film 220 may include, for example, TaO, TaAlO, TaON, AlO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or a combination thereof.

The upper electrode 230 may include, for example, doped silicon, Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination thereof.

FIGS. 11A to 11D illustrate that a top surface of the insulating structure 195 and a bottom surface of each of the lower electrodes 210 are positioned at the same level, but the embodiment is not limited thereto. For example, the level of the top surface of the insulating structure 195 may be positioned higher than the level of the bottom surface of the lower electrode 210, and the lower electrode 210 may extend into the insulating structure 195 toward the substrate 110.

The semiconductor device 1 includes the substrate 110 in which the plurality of active regions 118 are defined, the plurality of gate dielectric films 122, the plurality of word lines 120, and the plurality of buried insulating films 124 which are sequentially formed inside the plurality of word line trenches 120T that pass through the plurality of active regions 118 inside the substrate 110. The semiconductor device 1 further includes the first and second insulating film patterns 112 and 114 covering the element separation films 116, the plurality of active regions 118, the plurality of buried insulating films 124, the plurality of bit line structures 140 above the first and second insulating film patterns 112 and 114, the plurality of insulating spacer structures 150 covering both the sidewalls of the plurality of bit line structures 140, the plurality of buried contacts 170 which fill the lower portions of the spaces defined by the plurality of insulating fences 180 and the plurality of insulating spacer structures 150 and which are connected to the plurality of the active regions 118, the plurality of landing pads which fill the upper portions thereof, extend above the bit line structures 140, and are spaced apart from each other with the insulating structure 195 therebetween, and the plurality of capacitor structures 200 including the plurality of lower electrodes 210 connected to the plurality of landing pad 190, the capacitor dielectric film 220, and the upper electrode 230.

The plurality of insulating fences 180 may be spaced apart from each other in the second horizontal direction (Y direction) and disposed along a space between a pair of the facing insulating spacer structures 150 of the plurality of insulating spacer structures 150 covering the opposite sidewalls of the plurality of bit line structures 140. Each of the plurality of insulating fences 180 may extend from between the plurality of buried contacts 170 to between the plurality of landing pads 190 in the vertical direction (Z direction).

Each of the plurality of insulating spacer structures 150 includes the first insulating spacer 152, the third insulating spacer 156, and the fourth insulating spacer 158. The air spacer AS is positioned between the first insulating spacer 152 and the third insulating spacer 156. In some embodiments, each of the plurality of insulating spacer structures 150 does not include one of the third insulating spacer 156 and the fourth insulating spacer 158. In some embodiments, each of the plurality of insulating spacer structures 150 may include the first insulating spacer 152 and the third insulating spacer 156. The air spacer AS may be positioned between the first insulating spacer 152 and the third insulating spacer 156. In some embodiments, each of the plurality of insulating spacer structures 150 may include the first insulating spacer 152 and the fourth insulating spacer 158. The air spacer AS may be positioned between the first insulating spacer 152 and the fourth insulating spacer 158.

The insulating structure 195 may be bent from an upper side of the insulating structure 195 toward a lower side of the insulating structure 195, so that the insulating structure 195 extends along the spaces between the landing pad 190 and the preliminary insulating spacer structure 150P. For example, the insulating structure 195 may be bent from the landing pad 190 toward the insulating capping line 148 of the bit line structure 140, so that the recess portion 190R extends with a slope relative to the first horizontal direction (X direction) and the vertical direction (Z direction). For example, the insulating structure 195 may have a sidewall extending along a sidewall of the landing pad 190 toward the substrate 110. As extending toward the substrate 110, the sidewall of the insulating structure 195 is closer to a sidewall of the bit line structure 140.

In some embodiments, the first vertical line UCL that extends along the center of the upper end of the insulating structure 195 with respect to the first horizontal direction (X direction) and the second vertical line LCL that extends along the center of the lower end of the insulating structure 195 with respect to the first horizontal direction (X direction) may be offset by the center shift distance CL from each other in the first horizontal direction (X direction). For example, the insulating structure 195 extends from the upper end of the insulating structure 195 toward the lower end of the insulating structure 195. The insulating structure 195 has the center shift distance CL in the first horizontal direction (X direction) from the landing pad 190 toward the bit line structure 140, and may be bent to extend with a slope relative to the first horizontal direction (X direction) and the vertical direction (Z direction).

In some embodiments, the center of the lower end of the insulating structure 195 and the center of the upper end of the air spacer AS may be aligned with each other in the vertical direction (Z direction).

Also, the insulating structure 195 may have a bottom surface of which at least a portion is substantially flat in the second horizontal direction (Y direction). That is, at least a portion of the top surface of the portion of the insulating fence 180 that is in contact with the bottom surface of the insulating structure 195 and the top surface of the portion of the landing pad 190 may be positioned substantially at the same level along the second horizontal direction (Y direction) with respect to the vertical direction (Z direction).

In this specification, an upper portion of the insulating structure 195 may refer to a portion between the two neighboring landing pads 190, and a lower portion of the insulating structure 195 may refer to a portion between one landing pad 190 and the bit line structure 140 which is spaced apart from and adjacent to the one landing pad 190.

A width of the lower portion of the insulating structure 195 with respect to the first horizontal direction (X direction) may be less than a width of the upper portion of the insulating structure 195 with respect to the first horizontal direction (X direction). The width of the insulating structure 195 with respect to the first horizontal direction (X direction) may substantially decrease from the upper end of the insulating structure 195 toward the lower end of the insulating structure 195.

The upper portion of the insulating structure 195, which is the portion between the two neighboring landing pads 190, extends substantially toward the substrate 110 in the vertical direction (Z direction). The lower portion of the insulating structure 195, which is the portion between one landing pad 190 and the bit line structure 140 which is spaced apart from and adjacent to the one landing pad 190, is bent from the one landing pad 190 toward the bit line structure 140, which is spaced apart from and adjacent to the one landing pad 190, so that the lower portion of the insulating structure 195 extends toward the substrate 110 with a slope relative to the first horizontal direction (X direction) and the vertical direction (Z direction). For example, the insulating structure 195 may have a sidewall extending along a sidewall of the landing pad 190 toward the substrate 110. In a direction extending toward the substrate 110, the sidewall of the insulating structure 195 gets closer to a sidewall of the bit line structure 140.

The center of the upper end of the insulating structure 195 with respect to the first horizontal direction (X direction) and the center of the upper end of the air spacer AS are not aligned with each other in the vertical direction (Z direction) but may be shifted a center shift distance CL from each other. For example, the center, in the first horizontal direction (X direction), of the upper end of the insulating structure 195 and the center, in the first horizontal direction (X direction), of the upper end of the air spacer AS, when viewed in a top down view, are spaced apart from each other by the center shift distance CL in the first horizontal direction (X direction). The center of the lower end of the insulating structure 195 with respect to the first horizontal direction (X direction) and the center of the upper end of the air spacer AS may be aligned with each other in the vertical direction (Z direction).

In the semiconductor device 1 according to the inventive concept, the insulating structure 195 is positioned between the plurality of landing pads 190 so that the plurality of landing pads 190 are spaced apart from each other. The insulating structure 195, between one landing pad 190 and the bit line structure 140 which is spaced apart from and adjacent to the one landing pad 190, may be bent from the one landing pad 190 toward the bit line structure 140, which is spaced apart from and adjacent to the one landing pad 190, so that the lower portion of the insulating structure 195 extends toward the substrate 110 with a slope relative to the first horizontal direction (X direction) and the vertical direction (Z direction). For example, the insulating structure 195 may have a sidewall extending along a sidewall of the landing pad 190 toward the substrate 110. Ina direction extending toward the substrate 110, the sidewall of the insulating structure 195 gets closer to a sidewall of the bit line structure 140. The insulating structure 195 is disposed between the sidewall of the landing pad 190 and the sidewall of the bit line structure 140.

Also, in an embodiment, the width of the lower portion of the insulating structure 195 with respect to the first horizontal direction (X direction) is smaller than the width of the upper portion of the insulating structure 195 with respect to the first horizontal direction (X direction). For example, the width of the insulating structure 195 with respect to the first horizontal direction (X direction) decreases from the upper end of the insulating structure 195 toward the lower end of the insulating structure 195.

Thus, even though the width of the lower portion of the landing pad 190 covering the sidewall of the bit line structure 140, that is, the width of a neck of the landing pad 190 with respect to the first horizontal direction (X direction) increases, a gap between the two neighboring landing pads 190 may be secured.

Also, the center of the lower end of the insulating structure 195 with respect to the first horizontal direction (X direction), which corresponds to the center of the bottom surface of the recess portion 190R, may be aligned with the center of the upper end of the air spacer AS in the vertical direction (Z direction). Therefore, before the insulating structure 195 is formed, the second insulating spacer 154 (FIGS. 8A and 8C) may be smoothly removed through the recess portion 190R. Thus, the air spacer AS may reduce parasitic capacitance between the plurality of bit lines 147. Therefore, the semiconductor device 1 according to the inventive concept may have improved operation speed and operation reliability.

While the inventive concept has been particularly shown and described with reference to embodiments thereof, it will be understood that various changes in form and details may be made therein without departing from the spirit and scope of the following claims.

What is claimed is:

1. A semiconductor device comprising:
a plurality of bit line structures disposed on a substrate, each of the plurality of bit line structures comprising a bit line, an insulating capping line, and an insulating spacer structure, the insulating capping line disposed on an upper surface of the bit line, and the insulating spacer structure covering a sidewall of the bit line and having an air spacer, and the bit line structures being spaced apart from each other in a first horizontal direction and extending parallel to each other in a second horizontal direction different from the first horizontal direction;
a plurality of buried contacts which fill lower portions of spaces between the plurality of bit line structures; and
a plurality of landing pads which fill upper portions of the spaces between the plurality of bit line structures, extend from upper surfaces of the plurality of buried contacts to upper surfaces of the plurality of bit line structures, and are spaced apart from each other by a plurality of insulating structures,
wherein a first insulating structure of the plurality of insulating structures is disposed between a first landing pad of the plurality of landing pads which are spaced apart from each other in the second horizontal direction with the plurality of insulating structures therebetween and a first bit line structure, adjacent to the first landing pad in the first horizontal direction, of the plurality of bit line structures, wherein the first insulating structure includes a sidewall extending along a sidewall of the first landing pad toward the substrate, wherein in a direction extending toward the substrate, the sidewall of the first insulating structure gets closer to a first sidewall of the first bit line structure, wherein a portion of the first insulating structure is disposed between the first bit line structure and the first landing pad and has a maximum width, in the first horizontal direction, at a level of an upper surface of the insulating capping line, and wherein a bottommost end of the first insulating structure contacts an air spacer of the first bit line structure.

2. The semiconductor device of claim 1, wherein, between the first landing pad and the first bit line structure which are spaced apart from each other in the first horizontal direction, the bottommost end of the first insulating structure and a center, in the first horizontal direction, of an upper end of the air spacer of the first bit line structure are vertically aligned with each other.

3. The semiconductor device of claim 2, wherein, between the first landing pad and the first bit line structure which are spaced apart from each other in the first horizontal direction, a center, in the first horizontal direction, of an upper end of the first insulating structure and the center, in the first horizontal direction, of the upper end of the air spacer of the first bit line structure, when viewed in a top down view, are spaced apart from each other in the first horizontal direction.

4. The semiconductor device of claim 1, wherein a width, in the first horizontal direction, of a lower portion of the first insulating structure is smaller than a width, in the first horizontal direction, of an upper portion of the first insulating structure.

5. The semiconductor device of claim 1, wherein the first insulating structure extends from between the first landing pad and a second landing pad adjacent thereto in the first horizontal direction to the air spacer of the first bit line structure, wherein the second landing pad is disposed on an upper surface of the first bit line structure and a second sidewall, opposite to the first sidewall, of the first bit line structure, and wherein a width, in the first horizontal direction, of the first insulating structure decreases toward the air spacer of the first bit line structure.

6. The semiconductor device of claim 1, wherein, between two landing pads of the plurality of landing pads which are spaced apart from each other in the first horizontal direction with the first insulating structure therebetween, the first insulating structure has a bottom surface of which at least a portion is flat in the second horizontal direction.

7. The semiconductor device of claim 1, wherein the plurality of landing pads are arranged in a hexagonal array pattern.

8. The semiconductor device of claim 7, wherein the plurality of landing pads are arrayed in a row in the first horizontal direction and arrayed in a zigzag pattern in the second horizontal direction.

9. The semiconductor device of claim 1, wherein a top surface of each of the plurality of landing pads is circular.

10. The semiconductor device of claim 1, further comprising:

a plurality of storage nodes on the plurality of landing pads, wherein the plurality of storage nodes are arranged in a hexagonal array pattern.

\* \* \* \* \*